United States Patent
Liu et al.

(10) Patent No.: US 10,026,741 B2
(45) Date of Patent: Jul. 17, 2018

(54) LOGIC-COMPATIBLE MEMORY CELL MANUFACTURING METHOD AND STRUCTURE THEREOF

(71) Applicant: TAIWAN SEMICONDUCTOR MANUFACTURING COMPANY LTD., Hsinchu (TW)

(72) Inventors: Ming Chyi Liu, Hsinchu (TW); Yu-Hsing Chang, Taipei (TW); Wei-Cheng Wu, Hsinchu County (TW); Shih-Chang Liu, Kaohsiung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/356,203

(22) Filed: Nov. 18, 2016

(65) Prior Publication Data

US 2018/0145085 A1 May 24, 2018

(51) Int. Cl.
*H01L 21/00* (2006.01)
*H01L 27/11521* (2017.01)
*H01L 27/11526* (2017.01)
*H01L 21/8234* (2006.01)

(52) U.S. Cl.
CPC .......... *H01L 27/11521* (2013.01); *H01L 21/823418* (2013.01); *H01L 21/823443* (2013.01); *H01L 21/823475* (2013.01); *H01L 27/11526* (2013.01)

(58) Field of Classification Search
None
See application file for complete search history.

(56) References Cited

U.S. PATENT DOCUMENTS

2010/0163966 A1* 7/2010 Kwon .............. H01L 21/28273 257/324
2011/0070725 A1* 3/2011 Power .............. H01L 21/28273 438/591

* cited by examiner

*Primary Examiner* — Reema Patel
(74) *Attorney, Agent, or Firm* — WPAT, P.C., Intellectual Property Attorneys; Anthony King

(57) ABSTRACT

The present disclosure presents a method of manufacturing a semiconductor structure, in which a memory cell is formed on a semiconductor substrate, the memory cell including a control gate, a select gate and a source region. A logic device is formed on the semiconductor substrate, where the logic device includes a gate layer and a source/drain region. The select gate is thinned such that the select gate is lower than an upper surface of the control gate. A silicidation operation is performed for the source region and the select gate of the memory cell, and a dielectric layer is deposited over the source region and the drain region of the memory cell, and the drain/source region of the logic device.

20 Claims, 32 Drawing Sheets

LOGIC-COMPATIBLE MEMORY CELL MANUFACTURING METHOD AND STRUCTURE THEREOF

BACKGROUND

Flash memories have played an important role in modern electronic devices. A typical flash memory comprises a number of memory cells arranged in arrays for storing information data. The memory cell is configured to store charges with a floating gate, which corresponds to the logic values of the memory cell. The programming and erasure of the floating gate are accomplished through the tunneling of charges into or away from the floating gate across the surrounding insulating features. In addition, the data readout is performed by accessing voltage or current level of in the memory cell resulting from the charges in the floating gate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
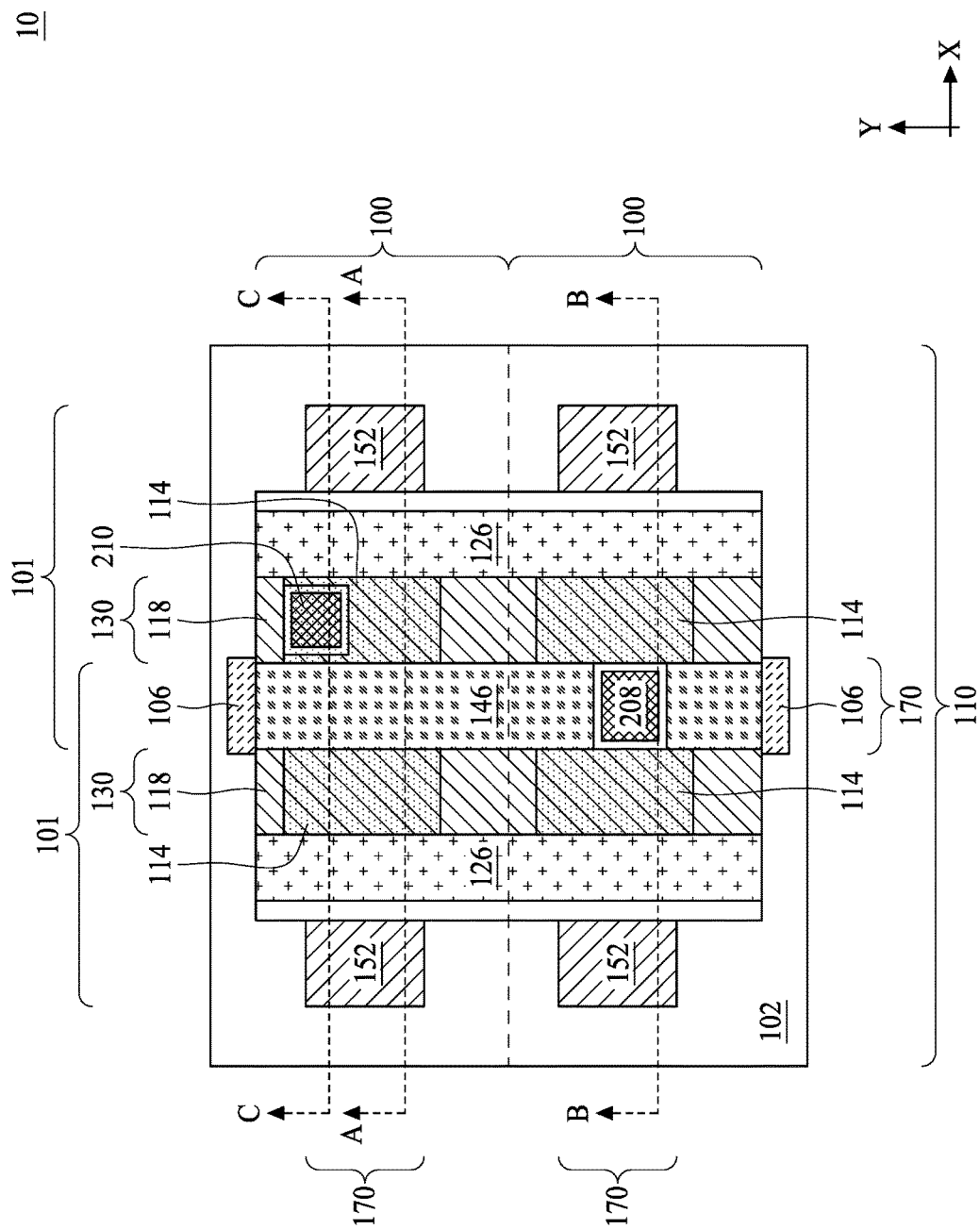
FIG. 1 is a top view of a semiconductor structure in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure presents a semiconductor structure, which includes logic devices and memory cell devices, and manufacturing methods thereof. The present disclosure discusses improved processing flows for the fabrication of logic-compatible memory cells, e.g., at least one lithography operation can be saved as compared to existing approaches. Furthermore, the performance and the structure stability for the memory cell can be improved. In addition, a void-free gap fill operation can be done more efficiently due to a decreased recess aspect ratio.

FIG. 1 is a top view of a semiconductor structure 10 in accordance with various embodiments of the present disclosure. The semiconductor structure 10 is comprised of a plurality of memory cell pairs 100, where only two exemplary memory cell pairs are illustrated. The memory cell pair 100 includes a semiconductor substrate 102 in which active regions 170 are formed. Each memory cell pair 100 has a pair of memory cells 101 formed in the semiconductor substrate 102. Further, the paired memory cells 101 share at least one gate feature or doped region, as will be elaborated herein.

Each memory cell 101 comprises a drain region 152, a select gate 126, a control gate structure 130, an erase gate 146 and a source region 106. The source region 106 and the erase gate 146 are shared by the paired memory cell 101. The erase gate 146 is disposed at a central position of the memory cell pair 100. The control gate structure 130 is disposed at one side of the erase gate 146. The select gate 126 is disposed at one side of the control gate structure 130 opposite to the erase gate 146. The drain region 152 is disposed at one side of the select gate 126 opposite to the control gate structure 130. The erase gate 146 is extended to a neighboring memory cell pair 100. Moreover, the control gate structure 130 includes a control gate 118 extending to a neighboring memory cell pair 100. Additionally, each control gate structure 130 of the memory cell 101 includes a floating gate 114. The floating gate 114 is substantially covered by the corresponding control gate 118. Structural details of cross-sectional views for the elements mentioned above are discussed in the following descriptions herein.

The active region 170 is formed in the semiconductor substrate 102. The active region 170 may include four legs extending horizontally (i.e., along X-direction) and two legs extending vertically (i.e., along Y-direction). The drain regions 152 are formed in the four horizontal legs of the active region 170 and separate with each other. Moreover, the source region 106 is formed as a vertical strip along the vertical legs of the active region 170. The source region 106 may be at least partially overlapped with the erase gate 146. The source region 106 is extending to a neighboring memory cell pair 100, and is thus referred to a common source region 106 throughout the present disclosure.

In a typical operation of the memory cell 101, the select gate 126 is electrically connected to a word line, the drain region 152 is electrically connected to a bit line, and the source region 106 is electrically connected to a source line. Also, the memory cell 101 is configured to perform a read operation and a write operation, e.g., program or erase operation, through application of proper voltages over the terminals such as the word line, bit line, source line, select gate 126, control gate 118 and the erase gate 146. Charges can thus be tunneled into the floating gate 118 or tunneled out of the floating gate under a write operation. Similarly, the logic value within the floating gate 118 may be accessed under a read operation.

Moreover, in order to make electrical connections for the terminals of the memory cell 101 mentioned above, conductive contact plugs or straps may be formed for connections. In some embodiments, a group of the gates which extend across multiple memory cell pairs 100 may share a conductive contact plug or strap. For example, two erase gates 146 respectively extending across two neighboring memory cell pairs 100 may share an erase gate contact plug. The contact plug may be formed of metallic materials or other conductive materials. In addition, the contact plug may serve as shunt for gates and doped regions formed of polysilicon materials, such that a much lower voltage drop may be obtained along the length than does of a polysilicon line. As a result, a more consistent voltage drop distribution is provided to each memory cell. In the illustrated embodiments, the contact plug may be the contact plugs 208 and 210 in FIG. 1. In some examples, the contact plug, e.g., the source region contact plug 208, may be extended through other conductive features such as the erase gate 146. In that case, insulating materials may be required to electrically isolate the contact plug and the conductive feature.

In the following descriptions, each figure set in FIGS. 2-12 represents different cross-sectional views of for manufacturing the semiconductor structure 10. The figures illustrating different cross-sectional views of a same intermediate stage are given figure numbers with letter A, B, or C. For example, in the first figure set, the figure numbers corresponding to two different views are identified as FIGS. 2A and 2B, respectively. In addition, the figure number with letter A shows a cross-sectional view of the memory device region 110 obtained from line A-A in FIG. 1, as well as a logic device region 111. Similarly, the figure number with letter B shows a cross-sectional view of the memory device region 110 obtained from line B-B in FIG. 1. Also, the figure number with letter C shows a cross-sectional view of the memory device region 110 obtained from line C-C in FIG. 1.

Figure 2A:
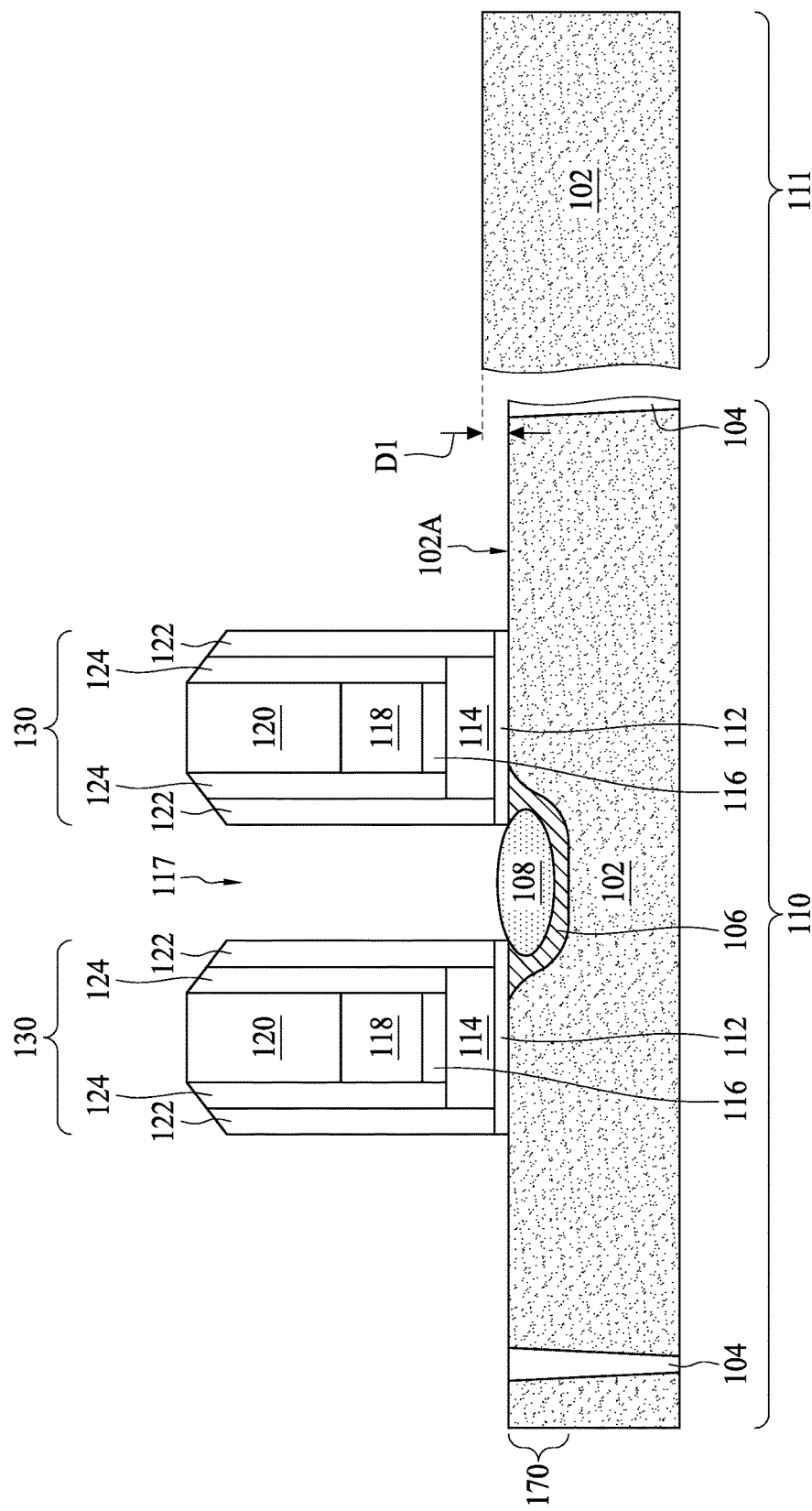
FIGS. 2A and 2B are cross-sectional views of intermediate stages in manufacturing of a semiconductor structure in accordance with various embodiments of the present disclosure.
Figure 2B:
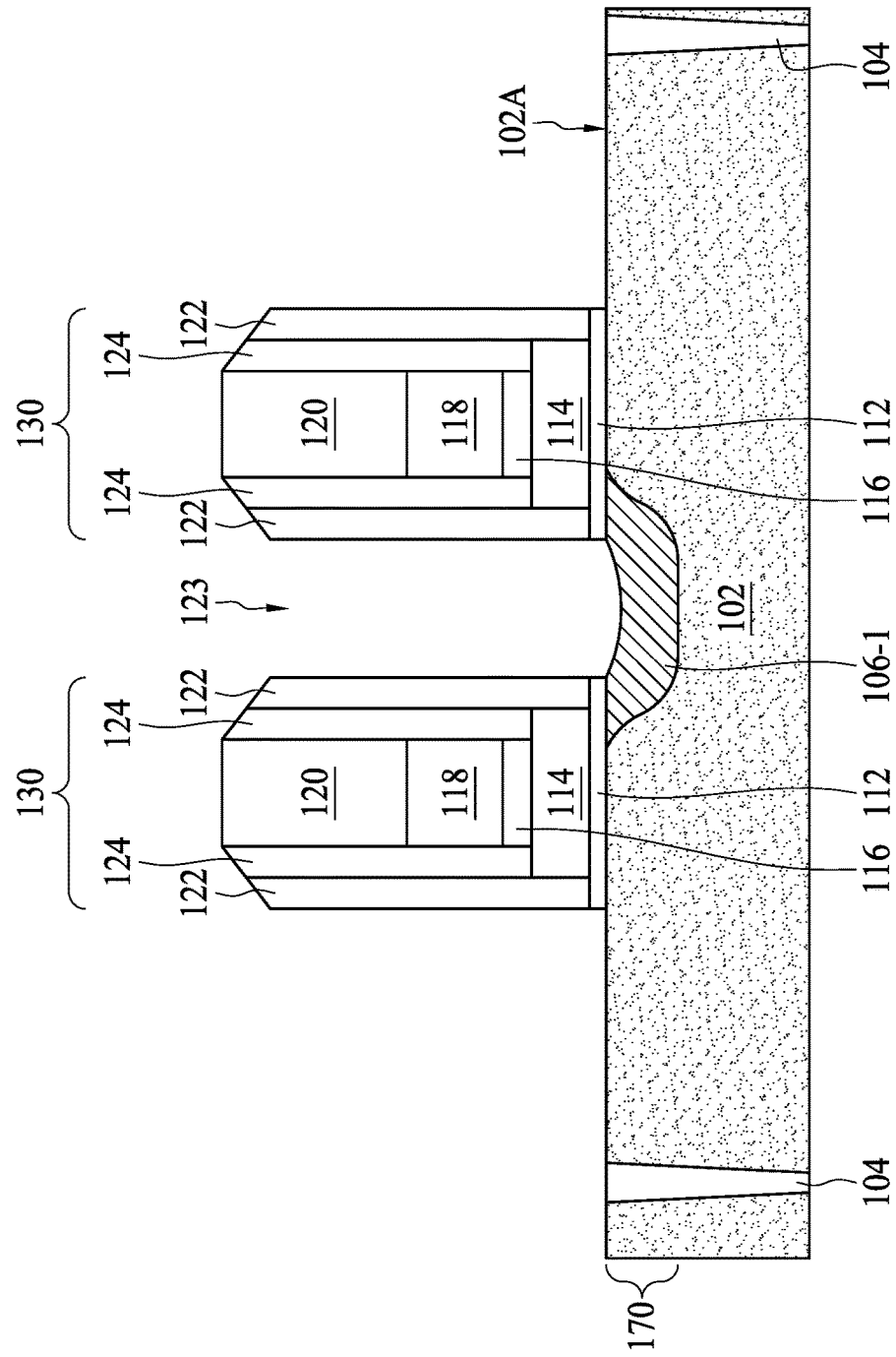

FIGS. 2A and 2B are cross-sectional views of intermediate stages in manufacturing the semiconductor structure 10 in accordance with various embodiments of the present disclosure. Referring to FIG. 2A, the semiconductor structure 10 comprises a memory cell pair 100. The memory cell pair 100 is formed within the memory device region 110

Initially, the semiconductor substrate 102 is provided or received. The semiconductor substrate 102 includes a semiconductor material such as silicon. In some embodiments, the semiconductor substrate 102 is a p-type semiconductive substrate (acceptor type) or n-type semiconductive substrate (donor type). Alternatively, the semiconductor substrate 102 includes another elementary semiconductor, such as germanium; a compound semiconductor including silicon germanium, silicon carbide, gallium arsenic, gallium phosphide, indium phosphide, indium arsenide, indium antimonide, combinations thereof or the like. In yet another alternative, the semiconductor substrate 102 is a semiconductor-on-insulator (SOI). In other alternatives, the semiconductor substrate 102 may include a multi-layer structure, in which a doped epitaxial layer, a gradient semiconductor layer, or the like may be adopted.

The semiconductor substrate 102 is then recessed in the memory device region 110. The recessed memory device region 110 includes a substantially planar upper surface 102A. The upper surface 102A is lower than an upper surface 102B for the logic device region 111 by a depth D1. In some embodiments, the depth D1 is from about 50 Å to about 1000 Å. Alternatively, the depth D1 may be from about 300 Å to about 800 Å.

Still referring to FIG. 2A, two control gate structures 130 are formed in the memory device region 110 of the semiconductor substrate 102 and are spaced apart from each other. Each of the control gate structures 130 includes a floating gate dielectric 112, a floating gate 114, a control gate dielectric 116, a control gate 118 and a mask layer 120. In some embodiments, the floating gate dielectric 112, the floating gate 114, the control gate dielectric 116, the control gate 118 and the mask layer 120 are formed in a stacked structure.

The floating gate dielectric 112 is formed over the semiconductor substrate 112. The floating gate dielectric 112 may include silicon dioxide or other suitable gate dielectric materials. The floating gate 114 is formed over the floating gate dielectric 112. The floating gate 114 is formed of a conductive material such as polysilicon or doped polysilicon. The floating gate 114 may be formed by deposition a blanket layer and patterning the blanket layer. The floating gate 114 is electrically isolated from other terminals of the memory cell 101, and thus is referred to as "floating gate".

Subsequently, the control gate dielectric 116 is formed over the floating gate 114. The control gate dielectric 116 may be formed of a suitable dielectric material, such as an oxide-nitride-oxide (ONO) composite layer. The control gate 118 is then formed over the control gate dielectric 116. The control gate 118 is formed of polysilicon, doped polysilicon or other suitable gate conductor materials. The control gate 118 is formed through patterning a deposited gate material. The mask layer 120 is formed over the control gate 118. The mask layer 120 is formed of dielectric materials, such as silicon nitride. Alternatively, the mask layer 120 may also include tetraethyl orthosilicate (TEOS).

A control gate spacer 124 is formed on sidewalls of the control gate dielectric 116, the control gate 118 and the mask layer 120. The control gate spacer 124 is formed of dielectric materials, such as oxide, nitride, or other suitable materials. The control gate spacer 124 includes a bottom side sitting on an upper surface of the floating gate 114. In addition, a floating gate spacer 122 is formed on sidewalls of the control gate spacer 124 and the floating gate 114. The floating gate spacer 122 is formed of dielectric materials, such as nitride, oxide, or other suitable materials. In some embodiments, the control gate spacer 124 and the floating gate spacer 122 may include different materials.

In addition, a doped region is formed as a common source region 106 in the semiconductor substrate 102 between the two control gate structures 130. A source dielectric 108 is disposed over the source region 106 in a trench 117 defined by the two control gate structures 130. In some embodiments, the source dielectric 108 is formed to electrically insulate the common source region 106 from the overlaying erase gate 146, which is to be formed in subsequent operations.

In addition, the memory device region 110 may be isolated by isolation features 104, such as shallow trench isolation (STI). Also, the isolation features 104 may be disposed in defining the boundaries of active regions 170. In some embodiments, the isolation features 104 may be disposed at boundaries of the ranges of doped regions, such as the drain regions 152 of the memory cell 101. The isolation features 104 are used for isolating the abovementioned doped regions from other features.

Referring to FIG. 2B, the illustrated cross-sectional view is similar to that shown in FIG. 2A, except there is a portion 106-1 of the common source region 106 being exposed from the source dielectric 108. An opening 123 is formed in the source dielectric 108 between the control gate structures 130. The portion 106-1 of the source region 106 is exposed from the opening 123. Moreover, the source region contact plug 208 as illustrated in FIG. 1 is to be formed in subsequent operations for electrically contacting the portion 106-1.

The cross-sectional view along the cross-sectional line C-C during the current stage of manufacturing operations is similar to that in FIG. 2A, and thus is not shown separately.

Figure 3A:
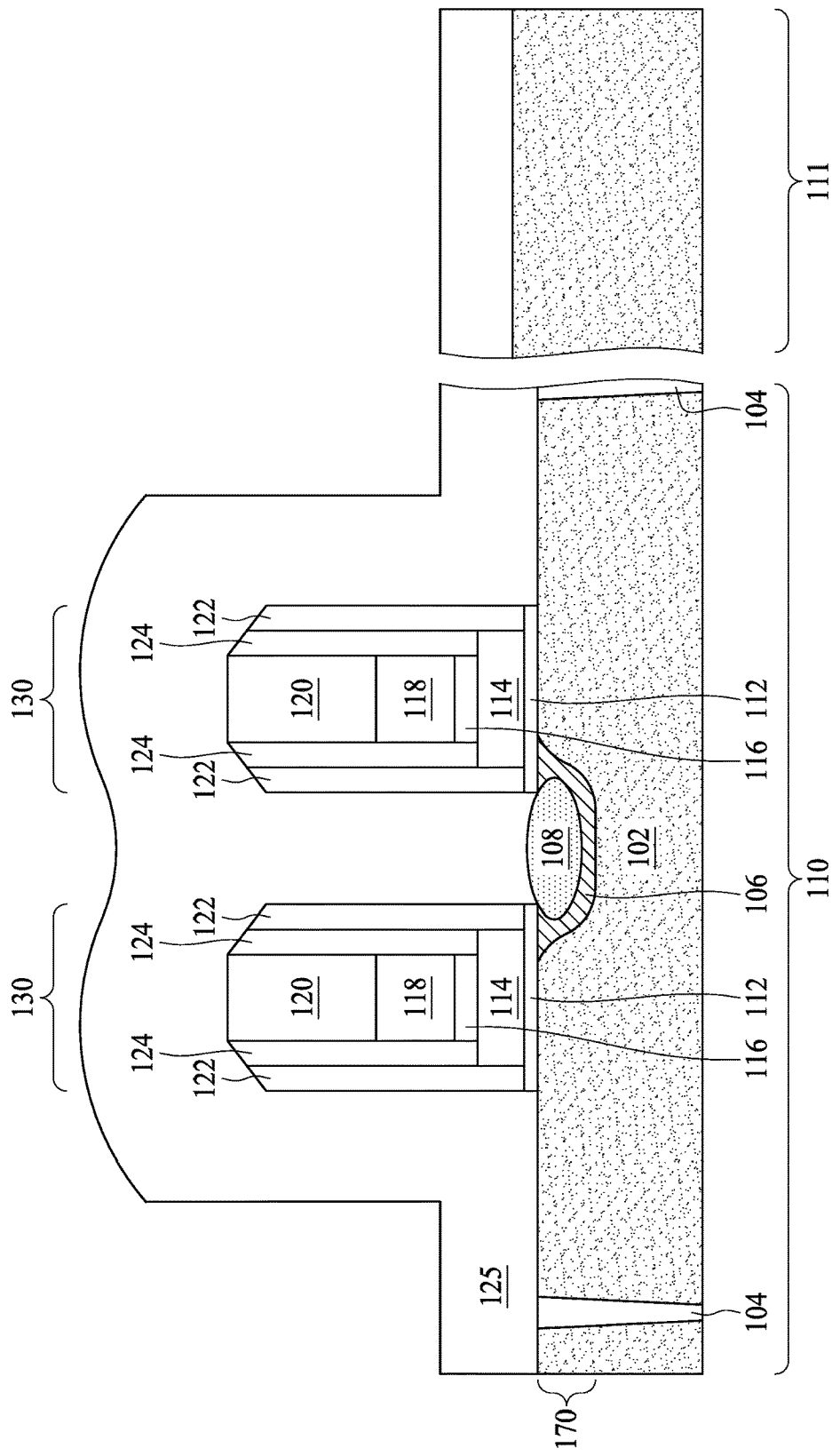
FIGS. 3A and 3B are cross-sectional views of intermediate stages in manufacturing of a semiconductor structure in accordance with various embodiments of the present disclosure.
Figure 3B:
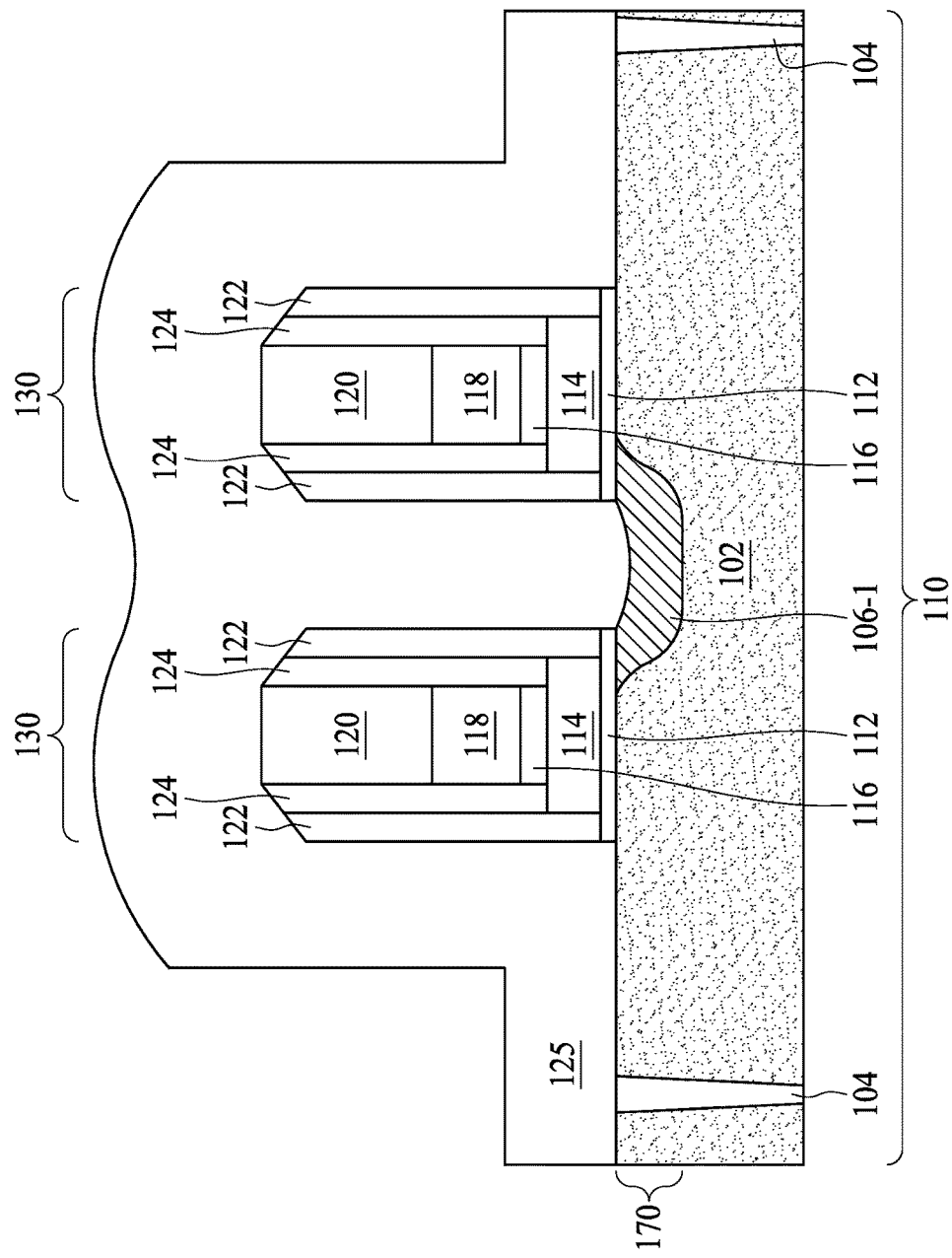

FIGS. 3A and 3B are cross-sectional views of intermediate stages in manufacturing the semiconductor structure 10 in accordance with various embodiments of the present disclosure. Referring to FIG. 3A, a gate material 125 is deposited over the control gate structures 130 and the common source region 106. The gate material 125 may be formed of conductive materials, such as polysilicon. In the illustrated embodiment where polysilicon is adopted as a gate material 125, a silicide film may be applied to the interface between the gate material and overlaying layers so as to lower resistance.

Referring to FIG. 3B, the gate material 125 covers the source region portion 106-1 and fills the opening 123. The cross-sectional view along the cross-sectional line C-C during the current stage of manufacturing operations is similar to that in FIG. 3A, and thus is not shown separately.

Figure 4A:
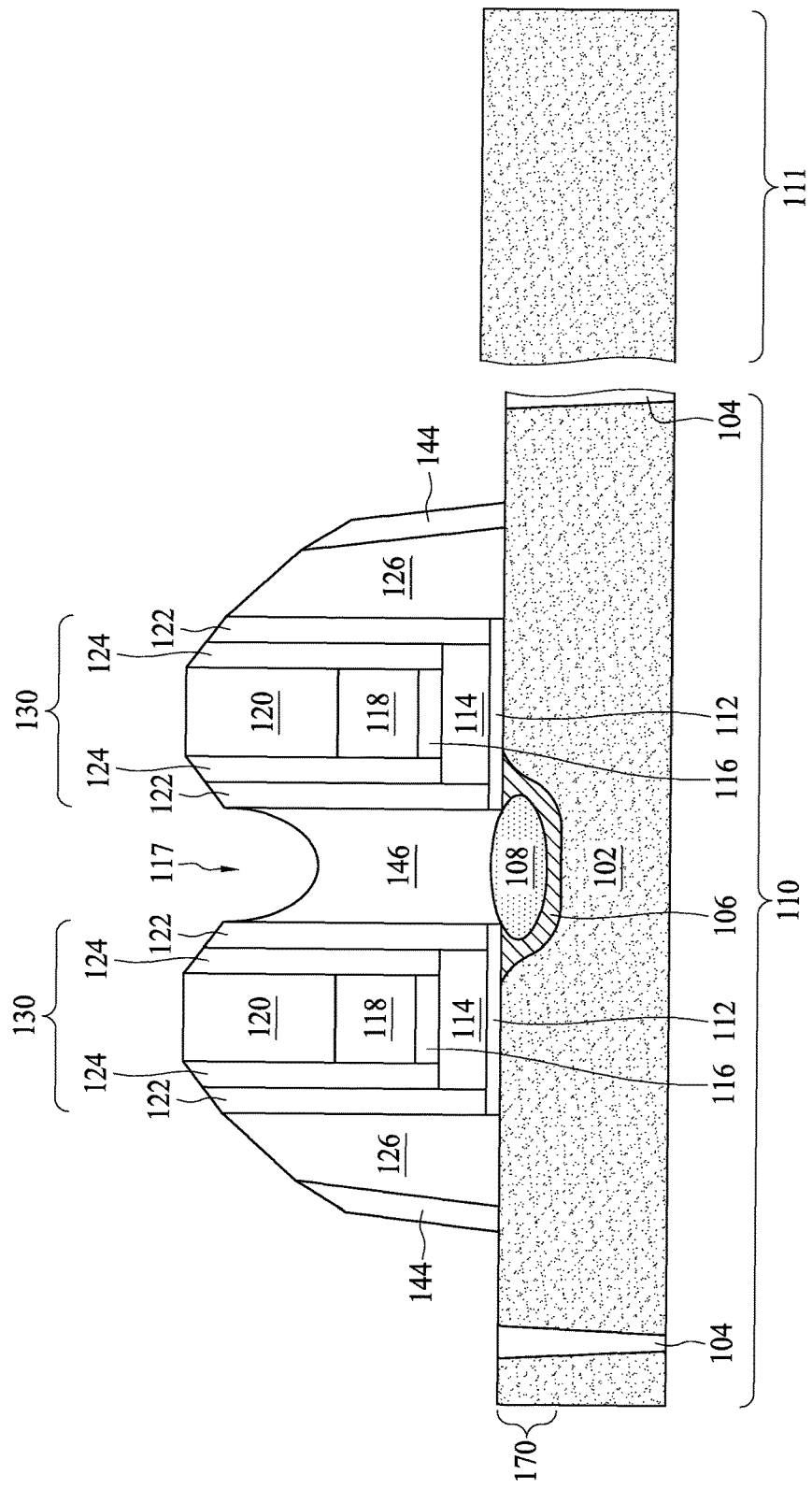
FIGS. 4A, 4B, and 4C are cross-sectional views of intermediate stages in manufacturing of intermediate stages in manufacturing of a semiconductor structure in accordance with various embodiments of the present disclosure.
Figure 4B:
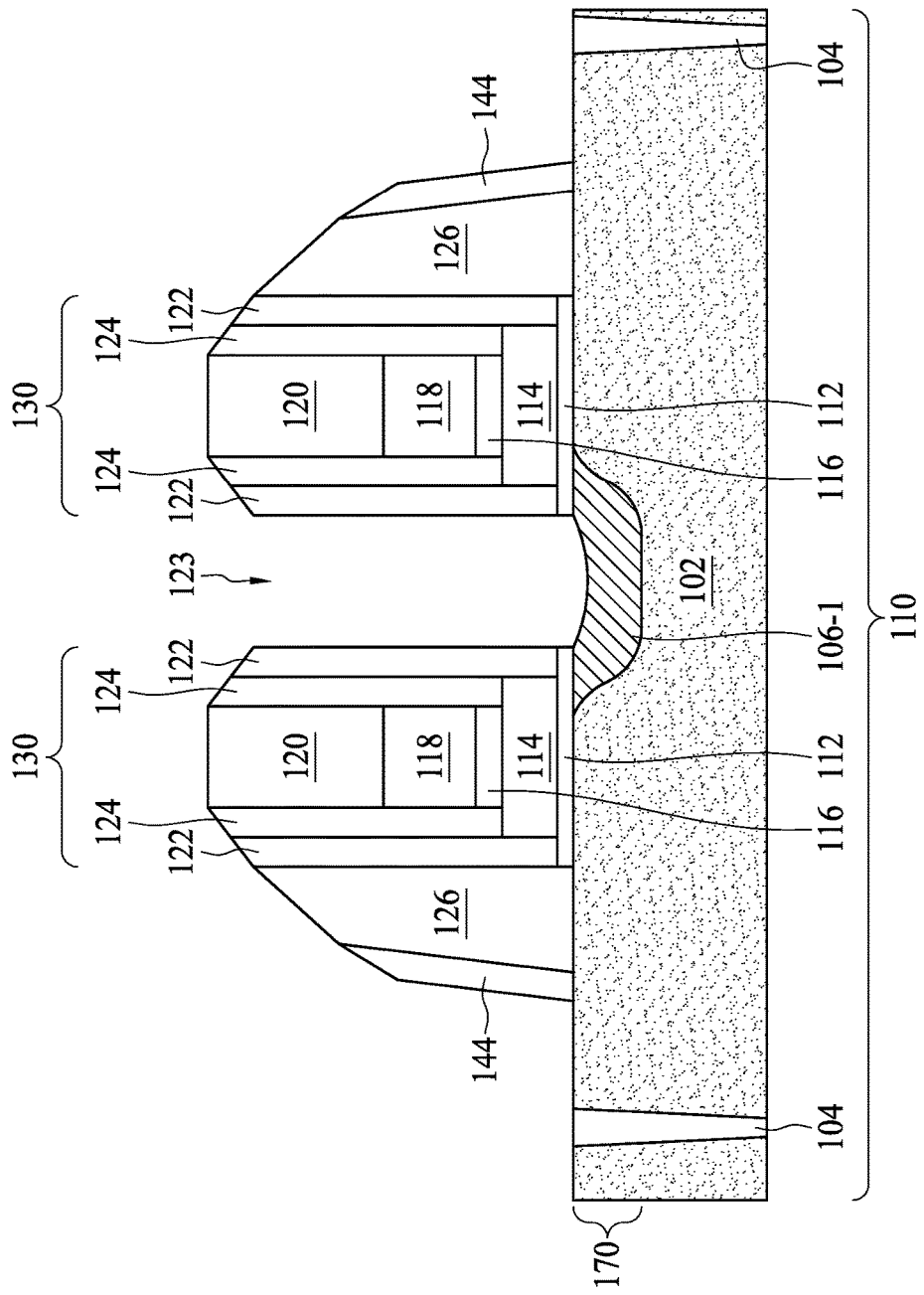
Figure 4C:
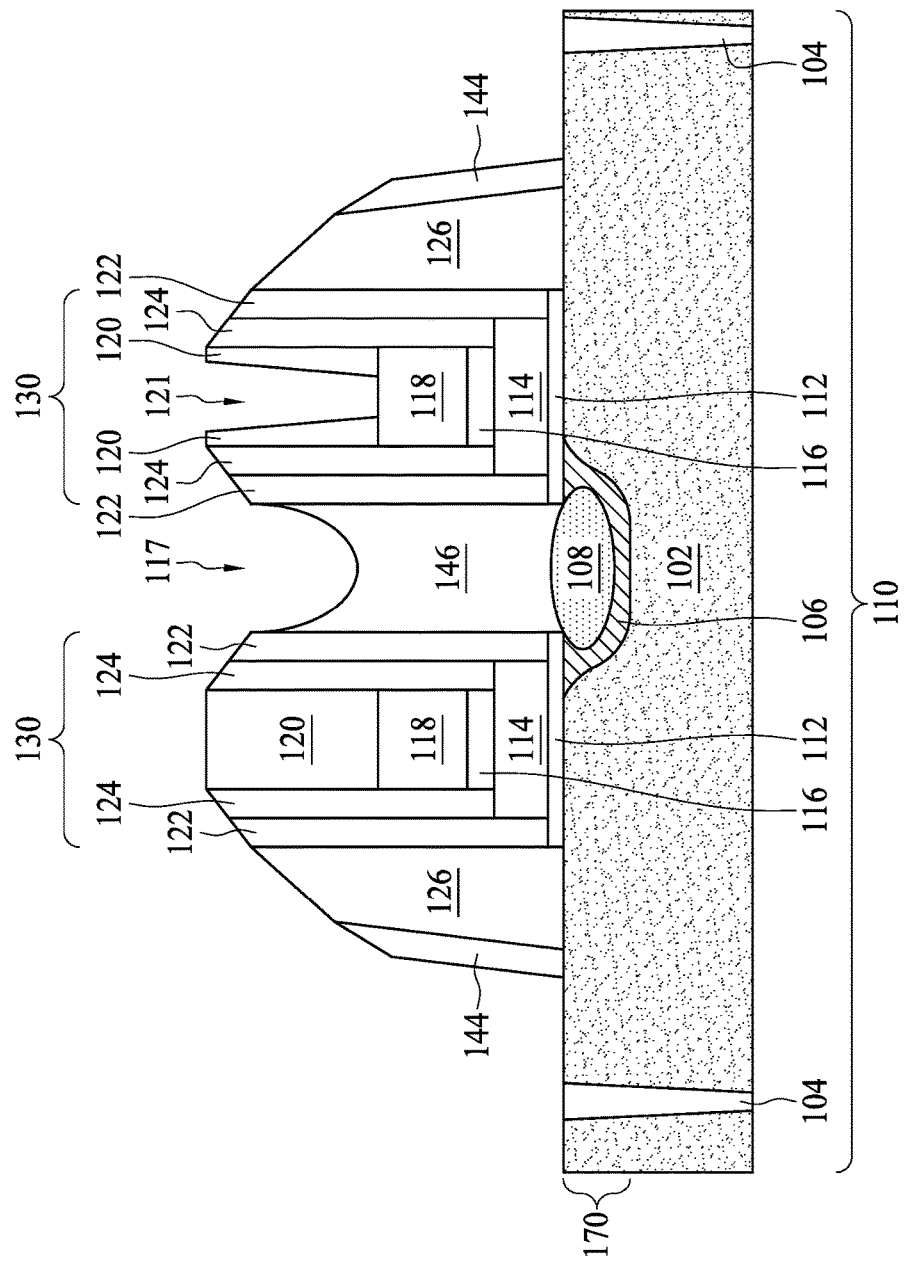

FIGS. 4A, 4B, and 4C are cross-sectional views of intermediate stages in manufacturing the semiconductor structure 10 in accordance with various embodiments of the present disclosure. Referring to FIGS. 4A and 4B, excessive gate material 125 is removed such that two select gates 126 are formed at outer sides of the two control gate structures 130. Additionally, referring to FIGS. 4A and 4C, the erase gate 146 is also formed in the trench 117 defined by the two floating gate spacers 122. The erase gate 146 is formed over the source dielectric 108. Referring to FIG. 1 and FIG. 4A, the select gates 126 and the erase gate 146 include patterns of a strip shape. In some embodiments, the select gates 126 and the erase gate 146 may include sloped top surfaces. In addition, portions of the semiconductor substrate 102 defined by the select gates 126 are exposed. Those exposed portions are used for the formation of the drain regions 152.

The removal of the excessive gate material 125 may be performed by an etch operation, such as a dry or wet etch process. In some embodiments, the dry etch operation may involve a reactive ion etching (RIE) method. In some embodiments, the etching operation may use an anisotropic etch in forming the strip-shaped select gate 126 and the erase gate 146. The dry etch etchant for the removal of the gate material 125 may include $Cl_2$, $BCl_3$, Ar, or fluorine-based chemicals. The wet etch etchant may include alkali-based solutions.

Next, a select gate spacer 144 is formed on outer sides of the select gates 126 opposite the control gate structure 130. The select gate spacer 144 may include a dielectric material and may, for example, be a nitride, an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The select gate spacer 144 may be formed by a suitable operation, and may include depositing a blanket dielectric material 144 to cover the control gate structure 130, the select gates 126 and the exposed portion of the surface 102A. Then, an anisotropic etch operation is performed to remove the horizontal portions of the blanket material 144, leaving vertical portions, i.e., the spacer 144, on the sidewalls of the select gates 126.

During the formation of the select gates 126 and the erase gate 146, the mask layers 120 of the control gate structure 130 are kept substantially intact as an etching mask. Subsequently, referring to FIG. 4B, the gate material 125 above the source region portion 106-1 is removed. The removal of the gate material 125 may be performed by depositing a patterned mask layer above the memory device region 110 and etching the gate material 125 in the opening 123. Thus, the source region portion 161-1 is exposed.

FIG. 4C illustrates the formation of a via 121 in the mask layer 120 subsequent to the formation of the select gates 126 and the erase gate 146. A portion of an upper surface of the control gate 118 is exposed accordingly. The via 121 may be formed by any suitable operations. For example, a mask layer may be used to define the via 121. Then, an etch is used to pattern the mask layer 120 and thus the via 121 is formed. The mask layer may be stripped after the via 121 is formed.

Referring to FIG. 4B and FIG. 4C, the configurations of the opening 123 and the via 121, such as their numbers, locations, and shapes, can be varied dependent upon different applications. For example, one via 121 may be shared by two, four, or eight memory cell pairs 100 in some embodiments. In addition, the via 121 or the opening 123 may be formed in a rectangular shape, polygonal shape, or round shape from a top view. In some embodiments, the location where the via 121 is formed may not be directly over the active region 170, as illustrated in FIG. 1.

Figure 5A:
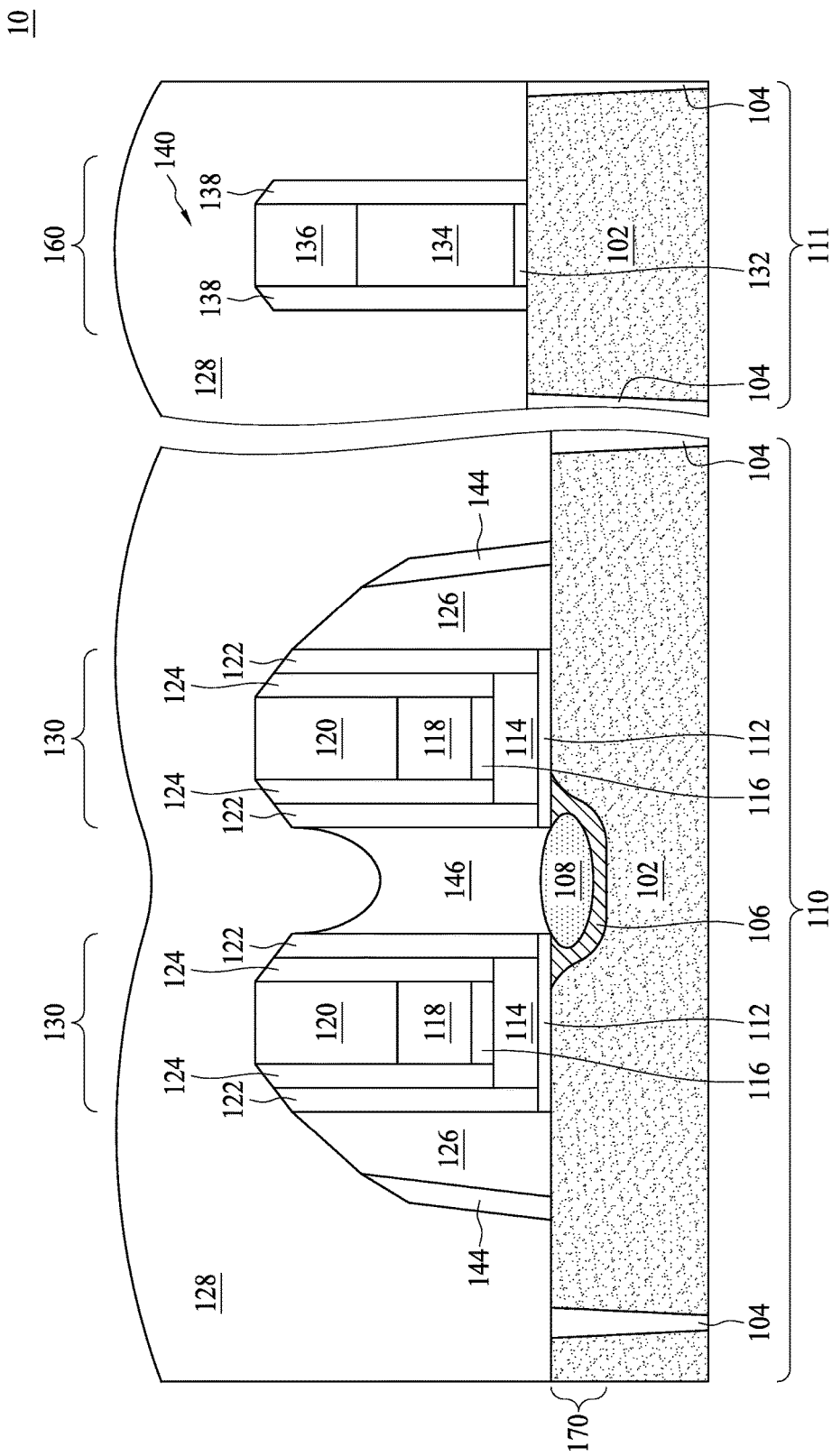
FIGS. 5A, 5B, and 5C are cross-sectional views of intermediate stages in manufacturing of a semiconductor structure in accordance with various embodiments of the present disclosure.
Figure 5B:
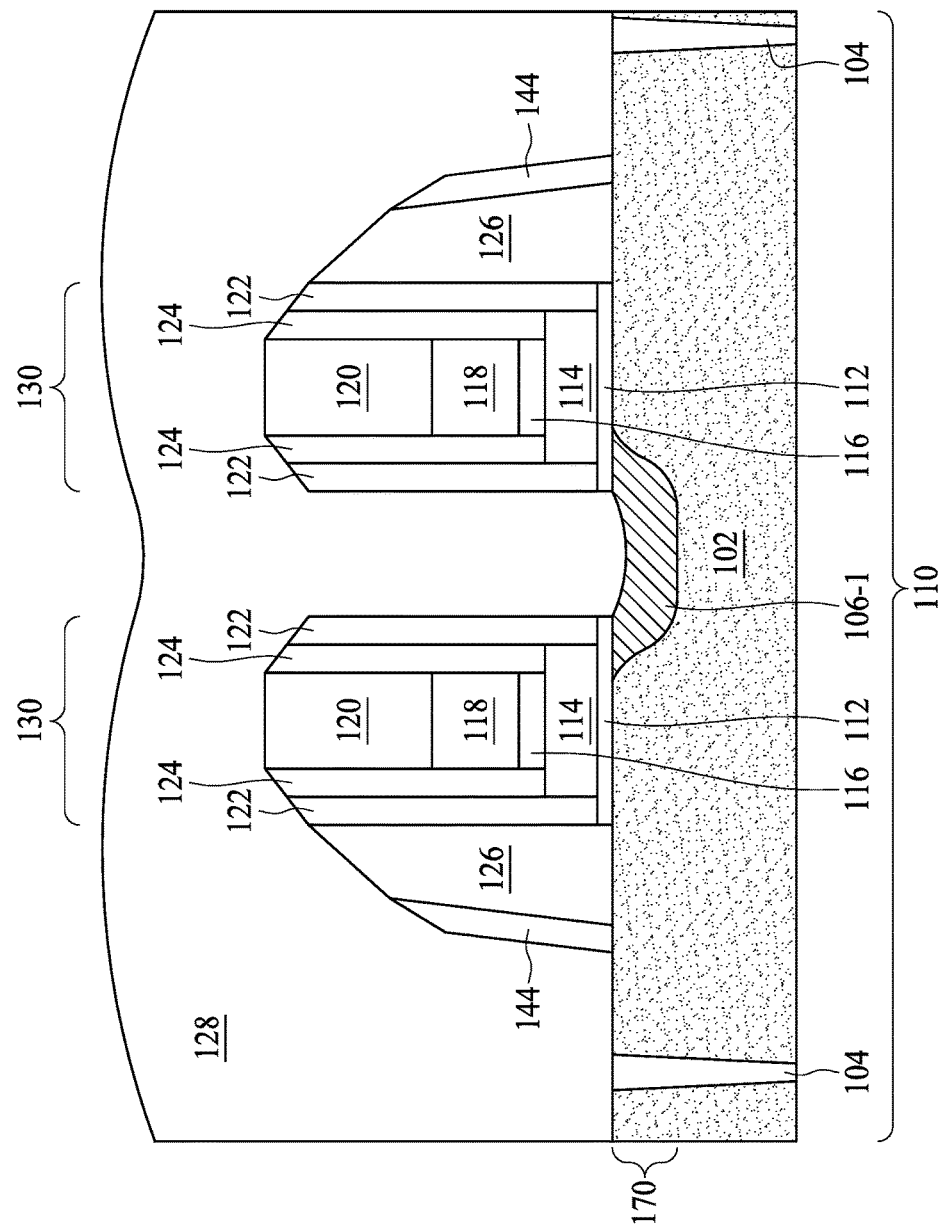
Figure 5C:
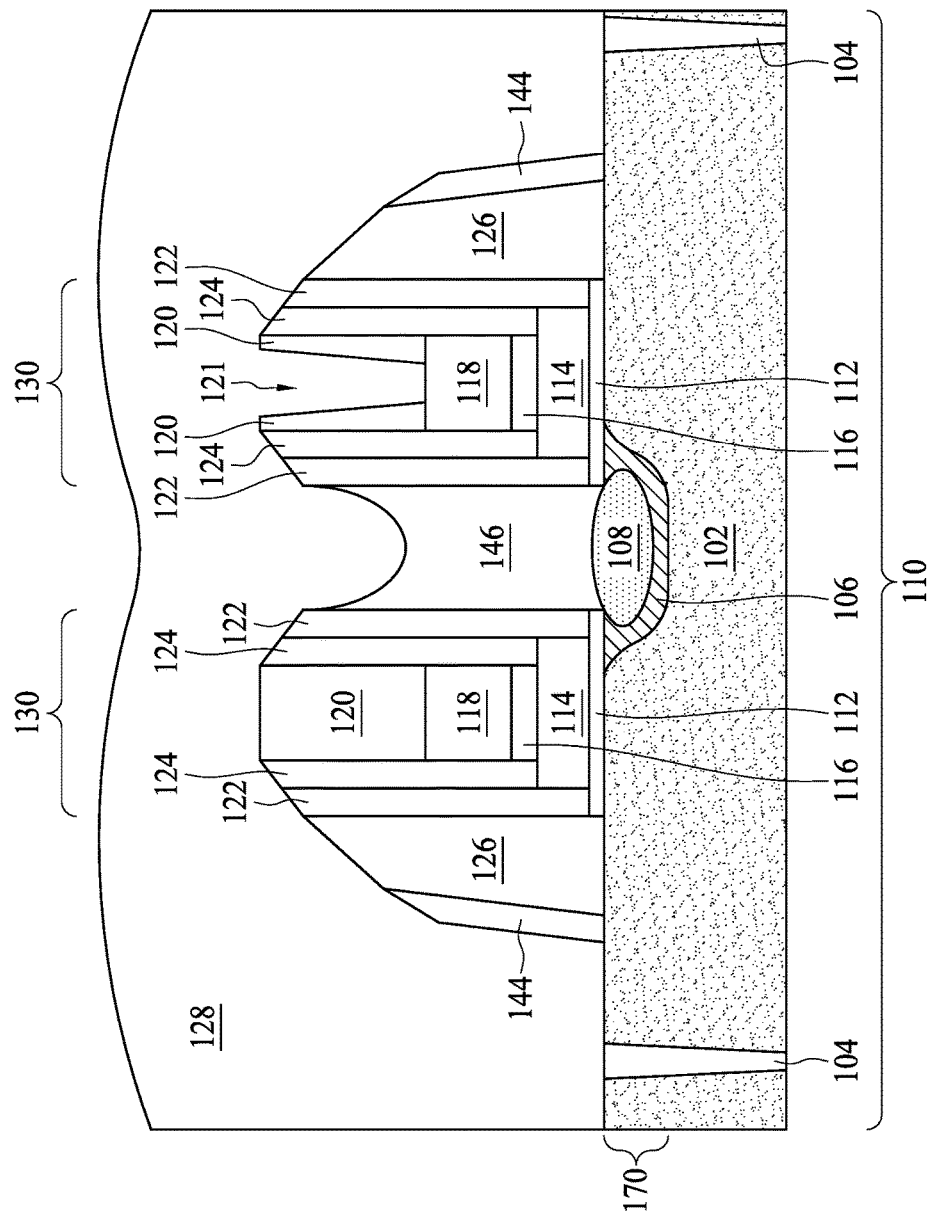

FIGS. 5A, 5B, and 5C are cross-sectional views of intermediate stages in manufacturing the semiconductor structure 10 in accordance with various embodiments of the present disclosure. Referring to FIG. 5A, a logic device 140 is formed within the logic device region 111. In some embodiments, the logic device 140 includes a core metal-oxide semiconductor (MOS) device, a high-voltage MOS device, a Static Random Access Memory (SRAM) device, an analog MOS device, an Input/output (IO) MOS device, combinations thereof or the like. In some embodiments, the memory device region 110 and the logic device region 111 may be spaced apart from each other. However, the memory device region 110 and the logic device region 111 are formed on a same substrate, wafer or chip. In some embodiments, the memory cells 101 and the logic device 140 may share one or more manufacturing operations. The manufacturing operations for the memory cells 101 are compatible with manufacturing operations for the logic devices 140. The processing cost and cycles for a composite semiconductor structure 10 are reduced accordingly.

Figure 8A:
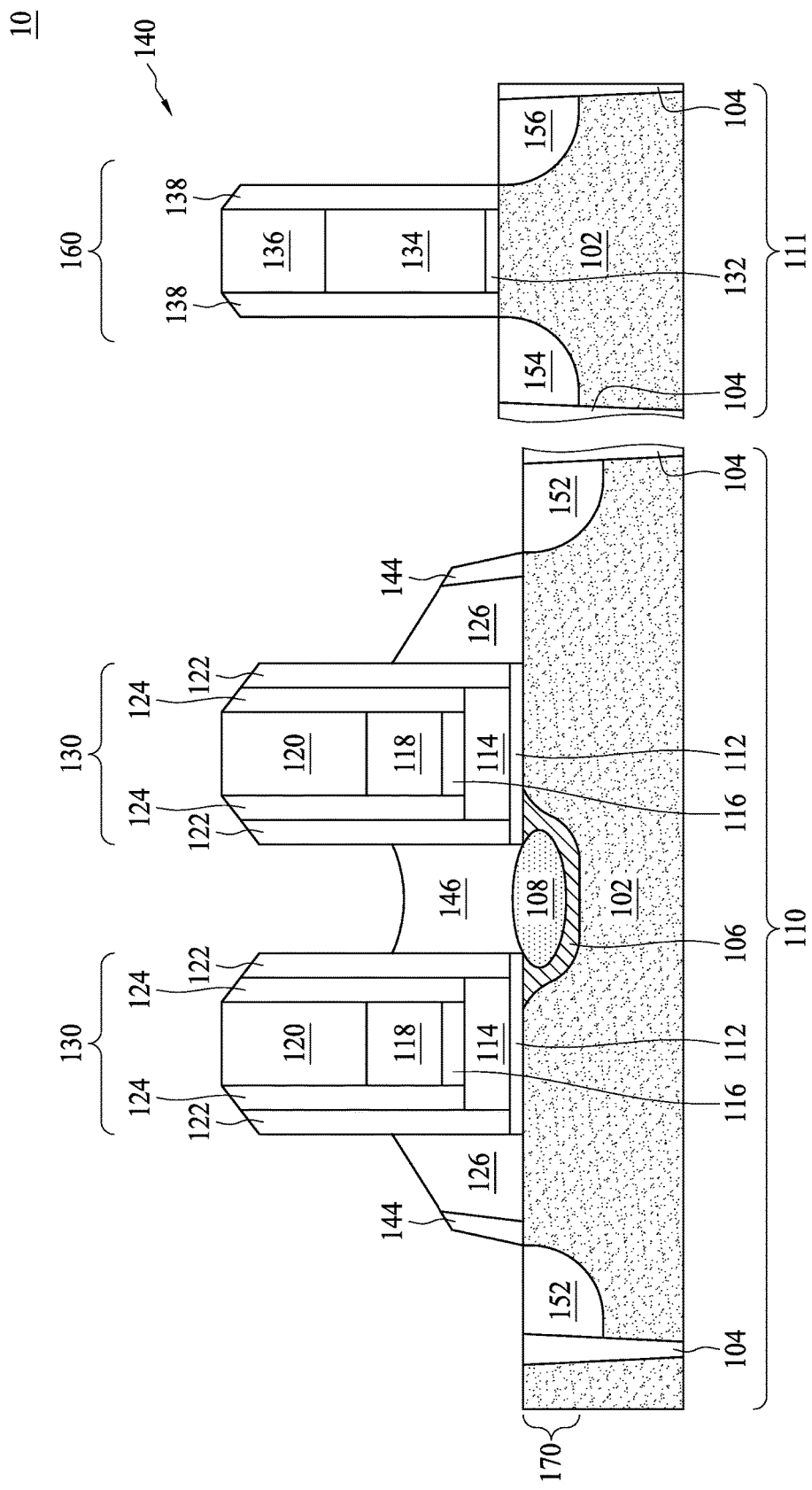
FIGS. 8A, 8B, and 8C are cross-sectional views of intermediate stages in manufacturing of a semiconductor structure in accordance with various embodiments of the present disclosure.

The logic device 140 includes a gate structure 160 and at least one source/drain region 154 and 156 (not shown in FIG. 2A, but illustrated in FIG. 8A). The gate structure 160 includes a gate dielectric 132, a gate layer 134, and a mask layer 136, formed in a stacked structure. The gate dielectric 132 is formed above the semiconductor substrate 102. The gate dielectric 132 is formed of dielectric materials, such as nitride and oxide. The gate layer 134 may be formed of polysilicon, doped polysilicon or other gate materials. In some embodiments, the gate layer 134 serves as a dummy gate and may be replaced by a replacement gate stack. The mask layer 136 may be a hard mask which includes materials similar to the mask layer 120, and may be formed of polysilicon; dielectric materials such as nitride, oxide; or a multi-layer structure, e.g., a nitride-oxide-nitride (ONO) film.

A gate spacer 138 is formed on sidewalls of the gate structure 160. The gate spacer 138 is formed of dielectric materials, such as nitride or oxide. In some embodiments, the gate spacer 138 includes a multi-layered structure. In some embodiments, the select gate spacer 144 may be formed subsequent to the formation of the gate structure 140 and may be formed along with the gate spacer 138. In some embodiments, the isolation features 104 may be formed to separate the logic device region 111 and the memory device region 110. In some embodiments, the isolation features 104 may be formed at boundaries of the source/drain regions 154 and 156.

Furthermore, a layer of coating 128 is deposited over the memory device region 110 and the logic device region 111. In some embodiments, the coating 128 is a bottom anti-reflective coating (BARC) layer. In alternative examples, the coating 128 is formed of a photoresist material. The coating 128 may be in physical contact with the source region portion 106-1. The coating 128 may be formed by suitable techniques including spin-on coating, chemical vapor deposition (CVD) or other operations.

Figure 6A:
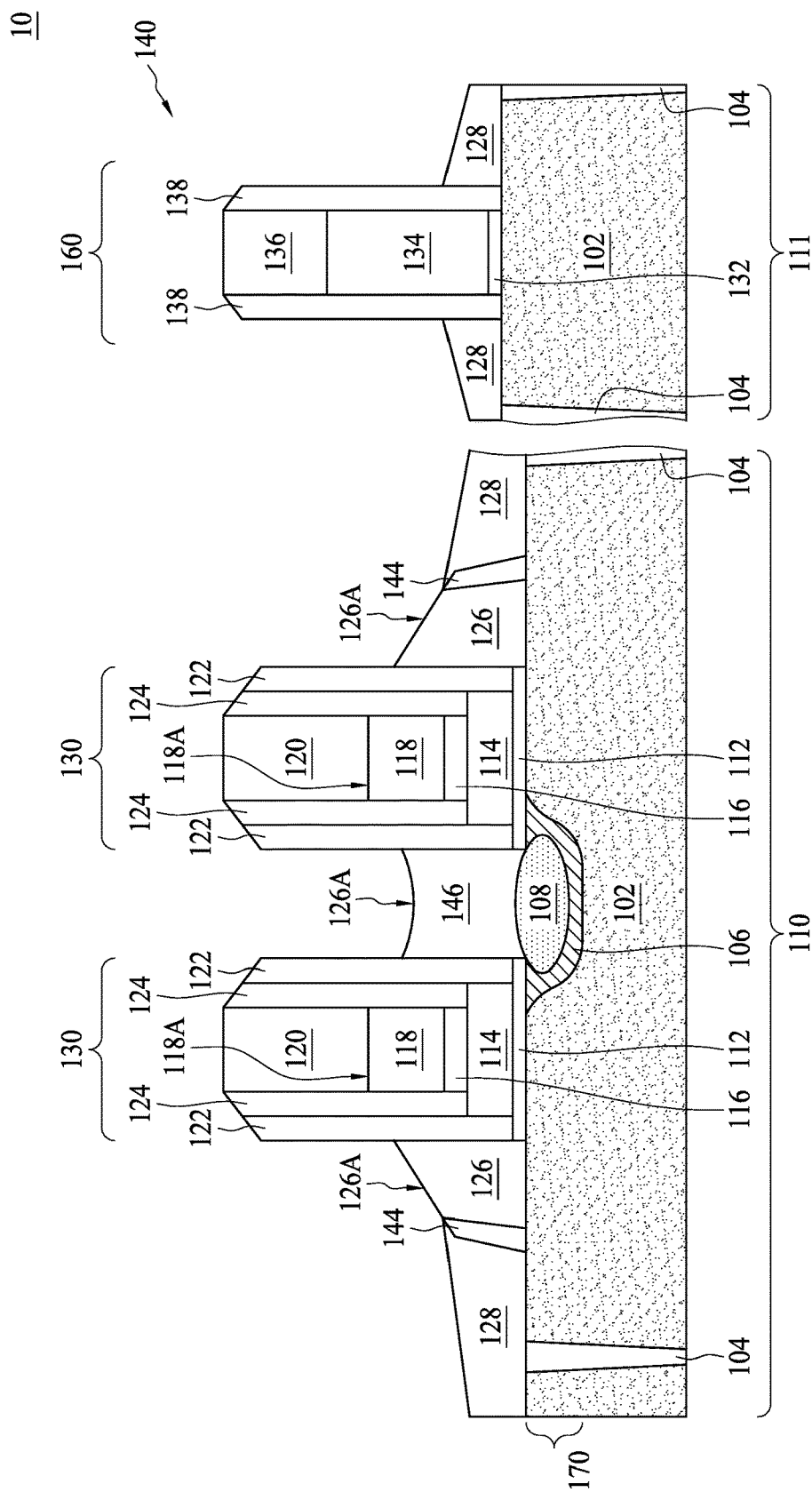
FIGS. 6A, 6B, and 6C are cross-sectional views of intermediate stages in manufacturing of a semiconductor structure in accordance with various embodiments of the present disclosure.
Figure 6B:
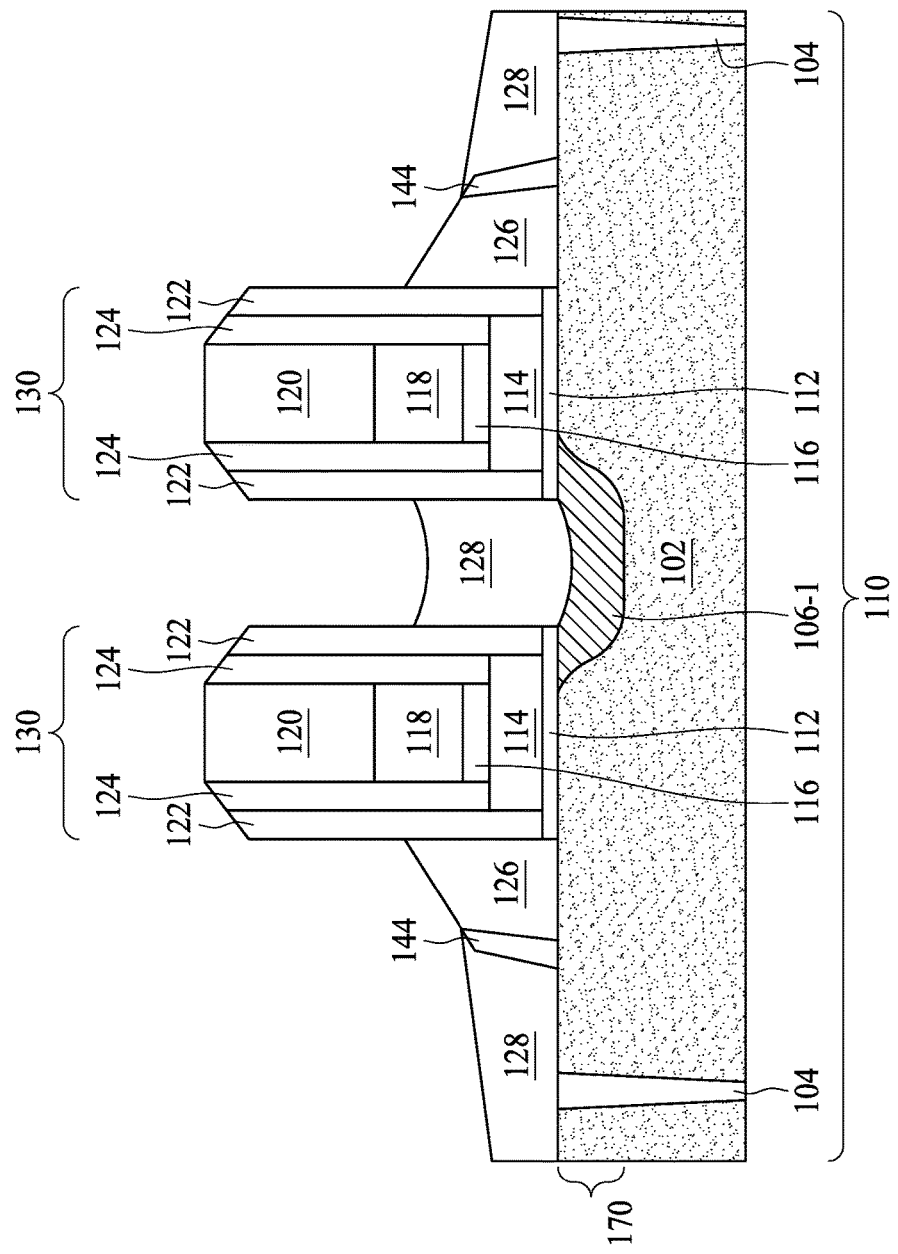
Figure 6C:
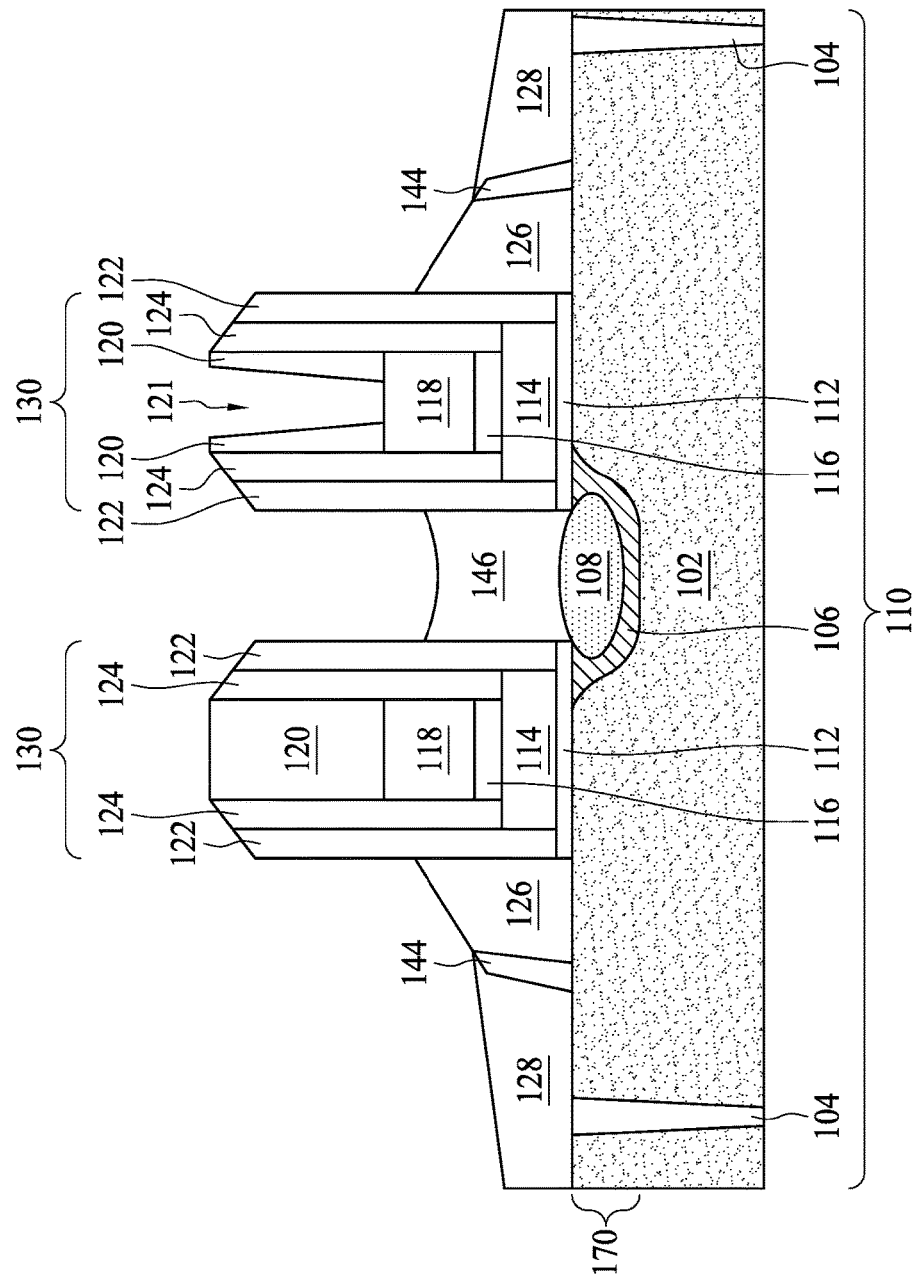

Referring to FIGS. 6A, 6B, and 6C, the erase gate 146 and the select gates 126 are thinned down. In the meantime, the previously-formed via 121 appears again in the mask layer 120 due to removal of the coating 128, as shown in FIG. 6C. The erase gate 146 or the select gate 126 is thinned down to a predetermined thickness, which is measured from the upper surface of the semiconductor substrate to the highest portion of the top surface 126A or 146A. The select gate 126 or the erase gate 146 may include a height no less than about 200 Å in order to facilitate the formation of the subsequently formed silicide layer. However, the gates 126 and 146 should be made lower enough in order to ensure that they would not be subjected to any subsequent planarization operations. That is because a planarization operation may degrade the performance of the silicide layer formed on the select gate 126 or the erase gate 146. In some embodiments, the thinned select gate 126 includes a thickness from about 200 Å to 1000 Å. In some embodiments, the select gate 126 is lower than the top surface 118A of the control gate 118 by a height. The height may be from about 50 Å to about 900 Å. In some embodiments, the height may be from about 200 Å to about 500 Å.

In some embodiments, the thinned select gate 126 includes a thickness from about 200 Å to about 900 Å. In some embodiments, the thinned select gate 126 includes a thickness from about 200 Å to about 500 Å. In some embodiments, the thinned erase gate 146 includes a thickness from about 200 Å to about 900 Å. In some embodiments, the thinned erase gate 146 includes a thickness from about 200 Å to about 500 Å. In some embodiments, the select gate is higher than the erase gate 146. In some embodiments, the select gate 126 and the erase gate 146 have substantially equal thickness.

During the thinning operation for the select gates 126 and the erase gate 146, a portion of the coating 128 covering the select gates 126 and the erase gate 146 is removed. In the meantime, another portion of the coating 128 on outer sides of the control gate structures 130 on the semiconductor substrate 102 is still left in the memory device region 110 after the thinning operation. Furthermore, yet another portion of the coating 128 on the sides of the gate structure 140 is also thinned and left in the logic device region 111. The thinned portions of the coating 128 in the memory device region 110 or the logic device region 111 may include a thickness similar to that of the thinned select gate 126 or the thinned erase gate 146.

In some embodiments, an etching operation is performed for thinning the formed erase gate 146 and the select gates 126. A self-aligned etch may be performed with the mask layers 120 and 136 along with the gate spacers 122, 124 and 138 as etching masks. In some embodiments, the gate material 125 and the coating 128 are etched with comparable etch rates, such as 1:1. The etching operation may be performed by a dry etching procedure, such as RIE, a wet etching, or other suitable operations. The select gate 126 or the erase gate 146 may be thinned to a level less than an upper surface 118A of the control gate 118. In the embodiment where a top surface 126A of the select gate 126 includes a curved or sloped surface. The highest point of the surface 126A is below the upper surface 118A of the control gate 118. Similarly, in the embodiment where the top surface 146A of the select gate 126 includes a curved or sloped surface, the highest portion of the surface 146A is below the upper surface 118A of the control gate 118.

Figure 7A:
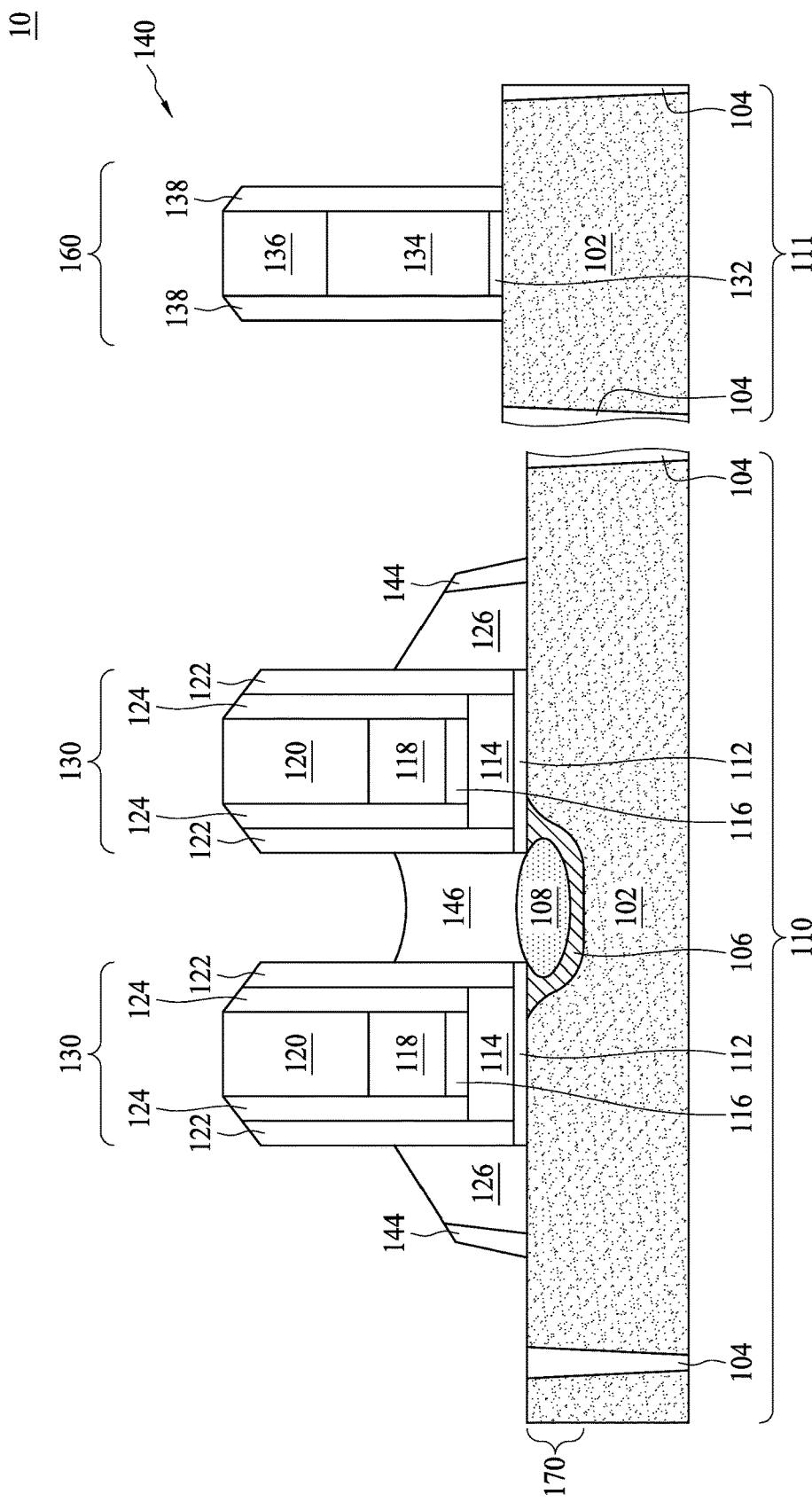
FIGS. 7A, 7B, and 7C are cross-sectional views of intermediate stages in manufacturing of a semiconductor structure in accordance with various embodiments of the present disclosure.
Figure 7B:
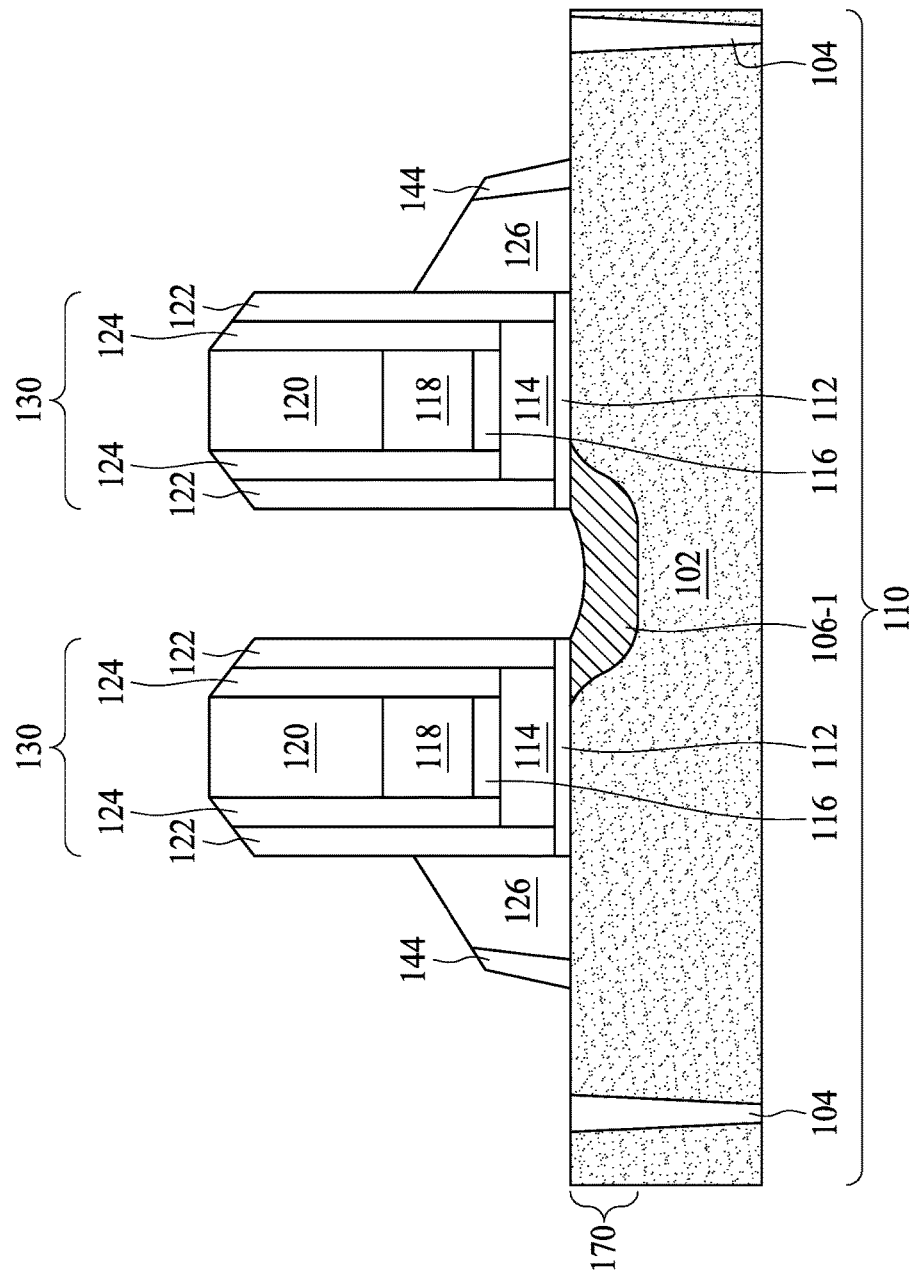
Figure 7C:
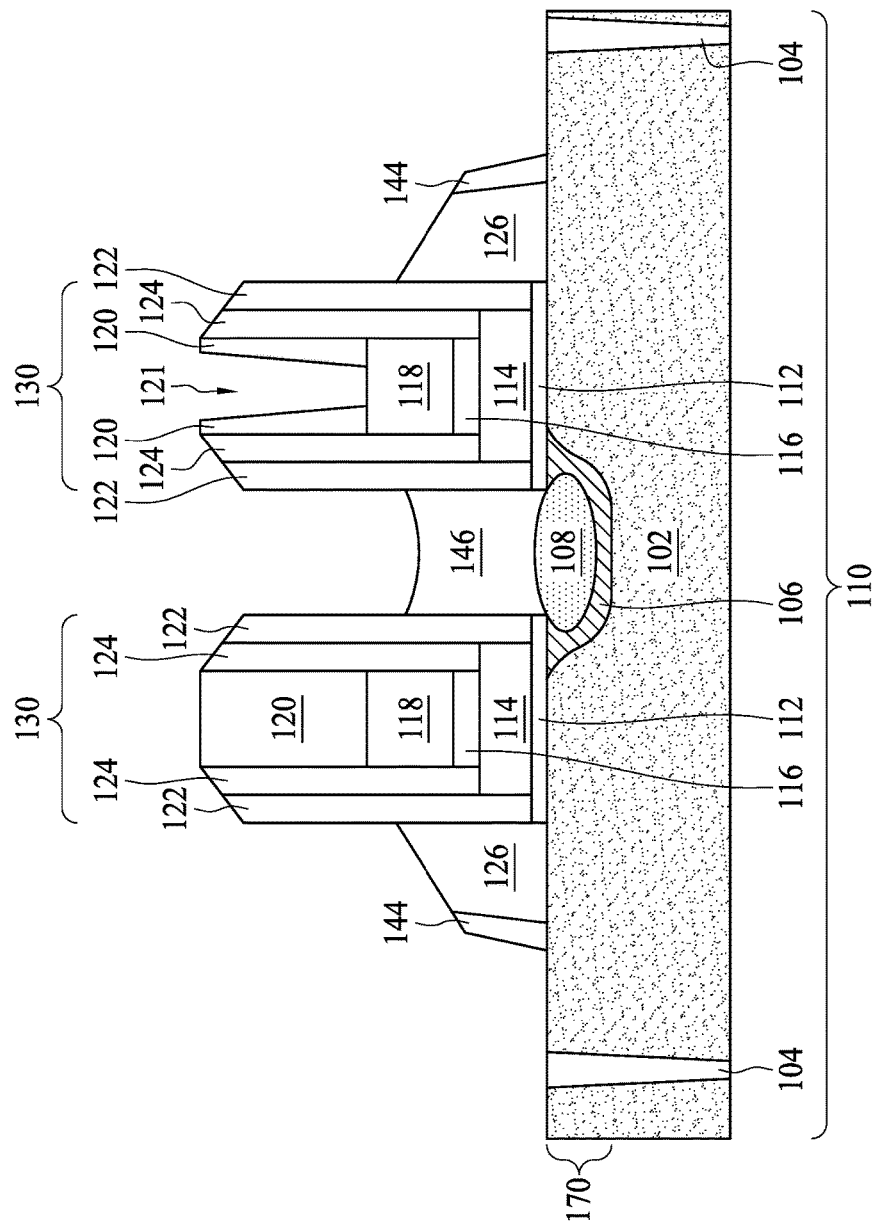

FIGS. 7A, 7B, and 7C are cross-sectional views of intermediate stages in manufacturing the semiconductor structure 10 in accordance with various embodiments of the present disclosure. Remaining portions of the coating 128 are removed subsequent to the thinning operation of the select gates 126 and the erase gate 146. The removal operation may be performed by a dry or wet etching operation for example. The etchant used for removing the residual coating materials 128 may include a high etch rate ratio between the coating material 128 and the gate material 125. In some embodiments, additional cleaning operations may be performed to remove residuals of the etched coating 128. Accordingly, surfaces of the semiconductor substrate 102 that are prepared for forming the drain regions 152 and the source/drain regions 154 and 156 are exposed. Further, the common source region portion 106-1 is also exposed as shown in FIG. 7B.

Figure 8B:
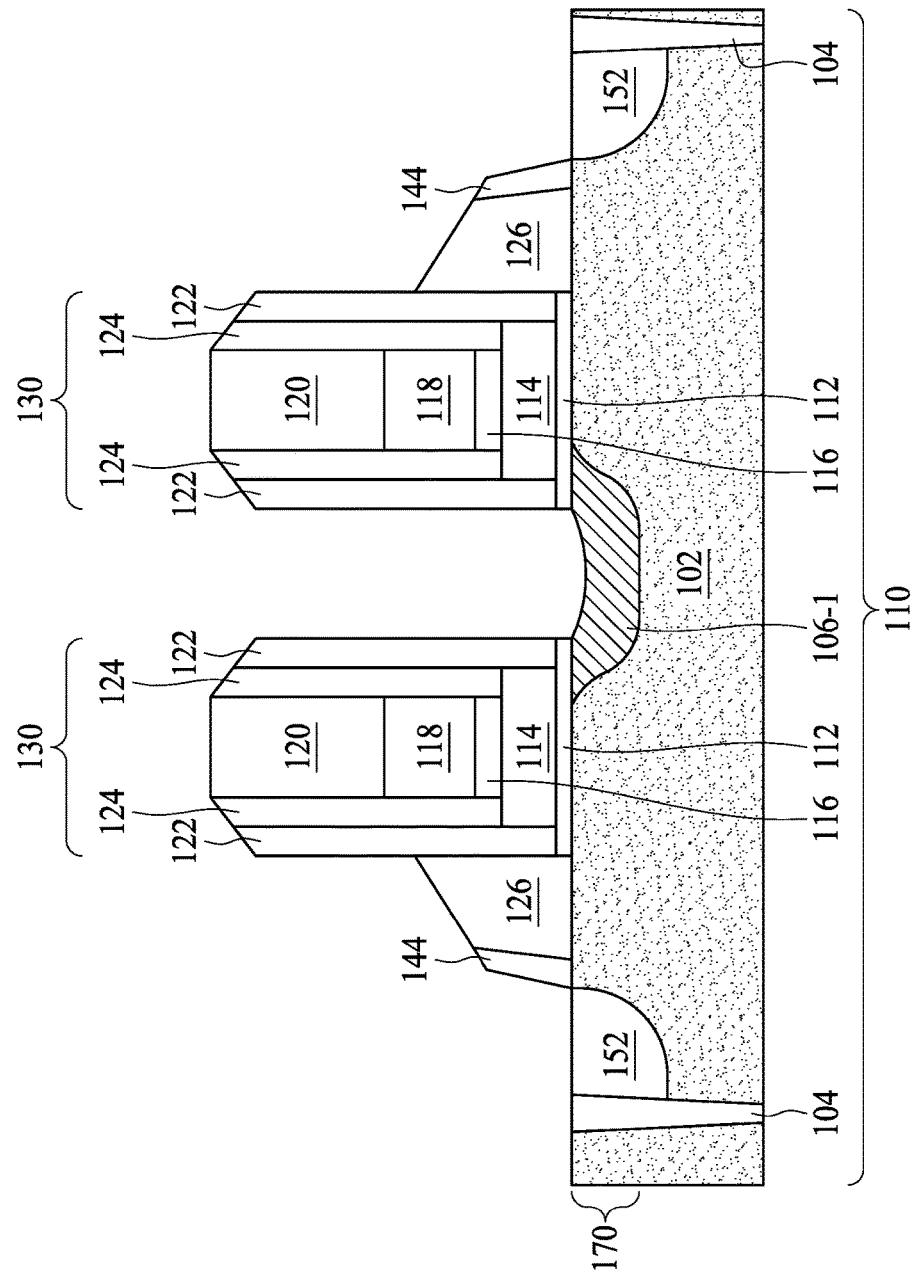
Figure 8C:
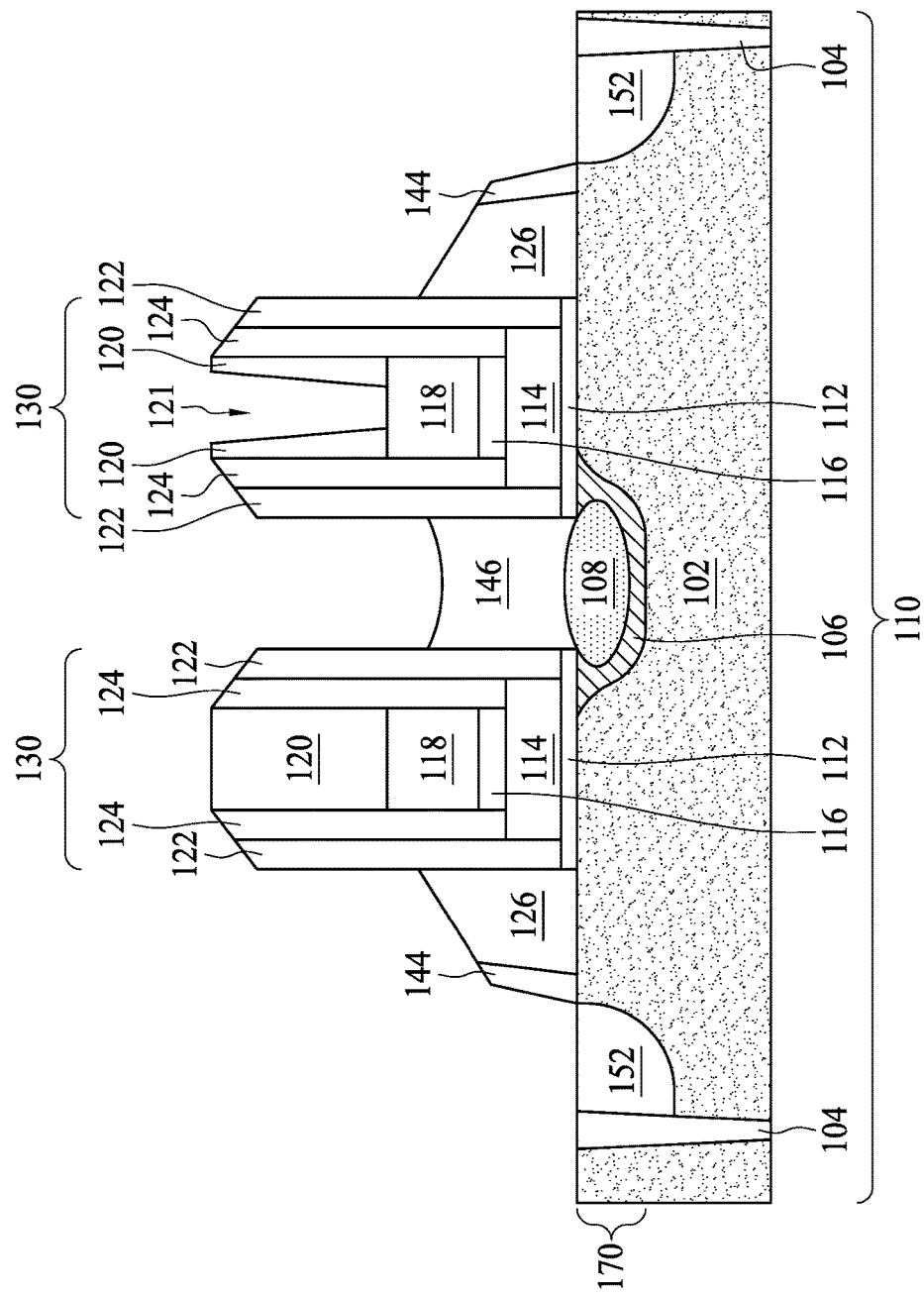

Referring to FIGS. 8A, 8B, and 8C, the drain regions 152 are formed within the active region 170. Similarly, the source/drain regions 154 and 156 are also formed. The source or drain regions may be formed by implantation operations within the areas defined by the spacers 144 and isolation features 104 in the memory device region 110, or the areas defined by the gate structure 160 and isolation regions 104 in the logic device region 111.

Figure 9A:
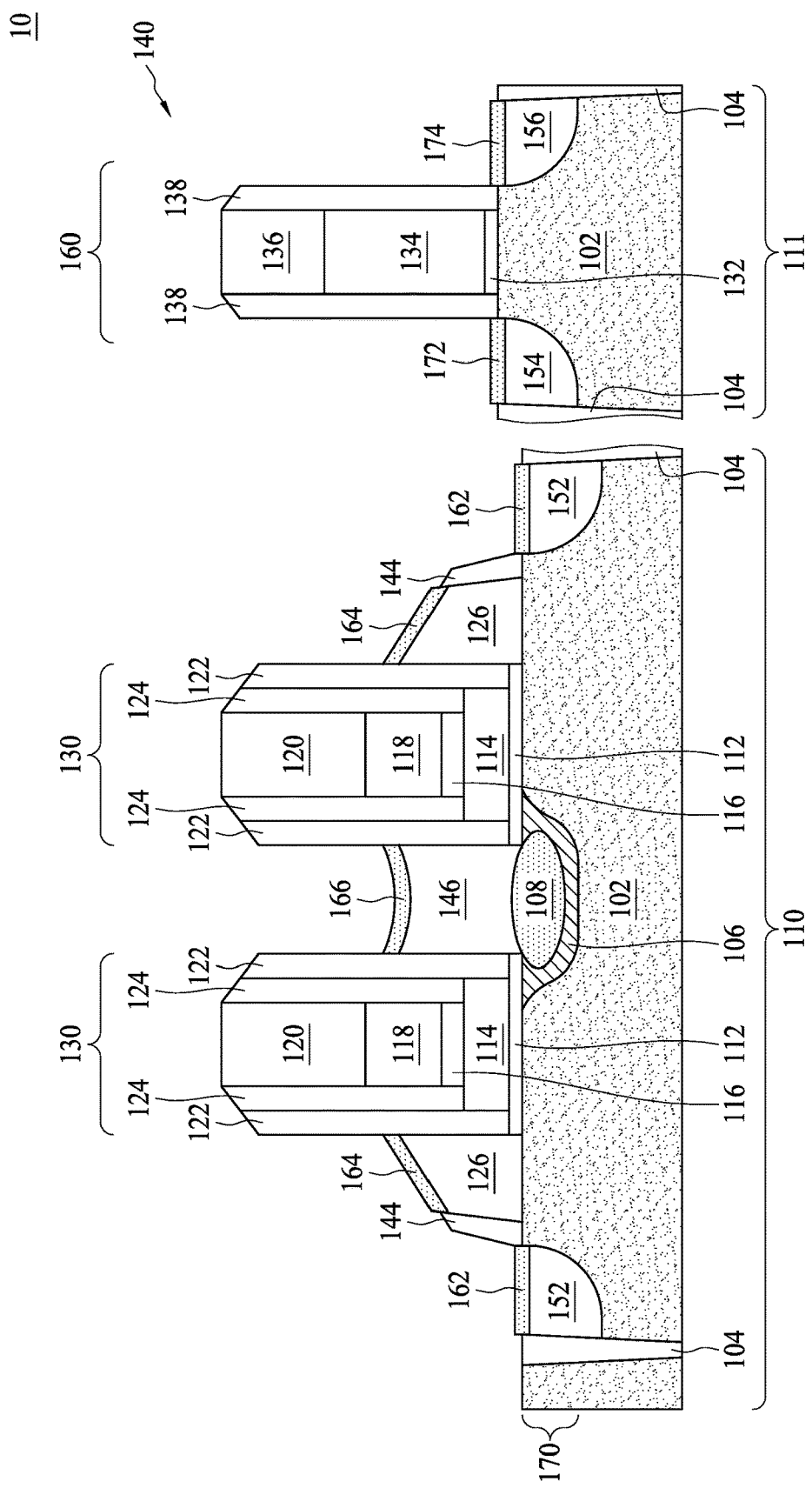
FIGS. 9A, 9B, and 9C are cross-sectional views of intermediate stages in manufacturing of a semiconductor structure in accordance with various embodiments of the present disclosure.
Figure 9B:
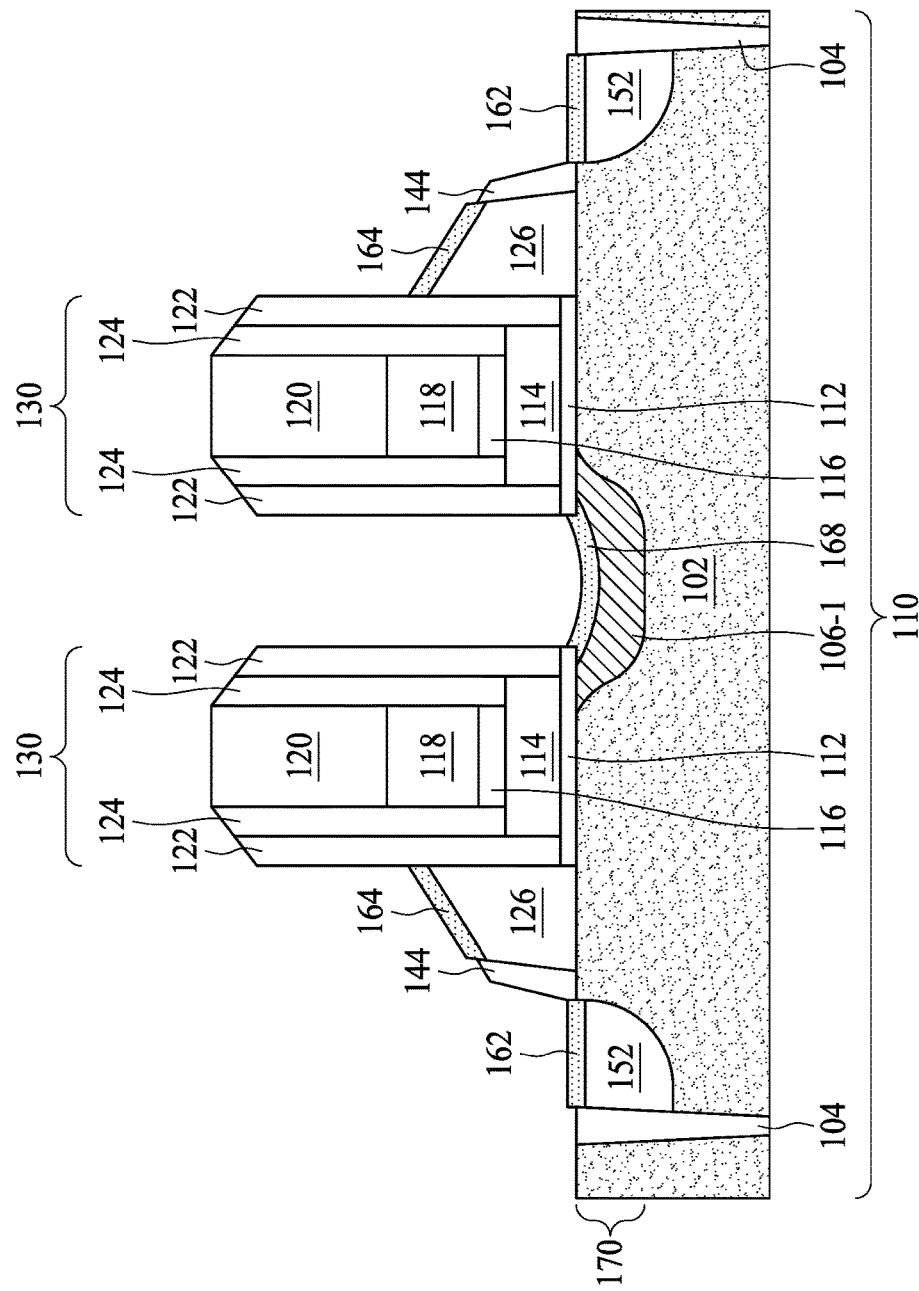
Figure 9C:
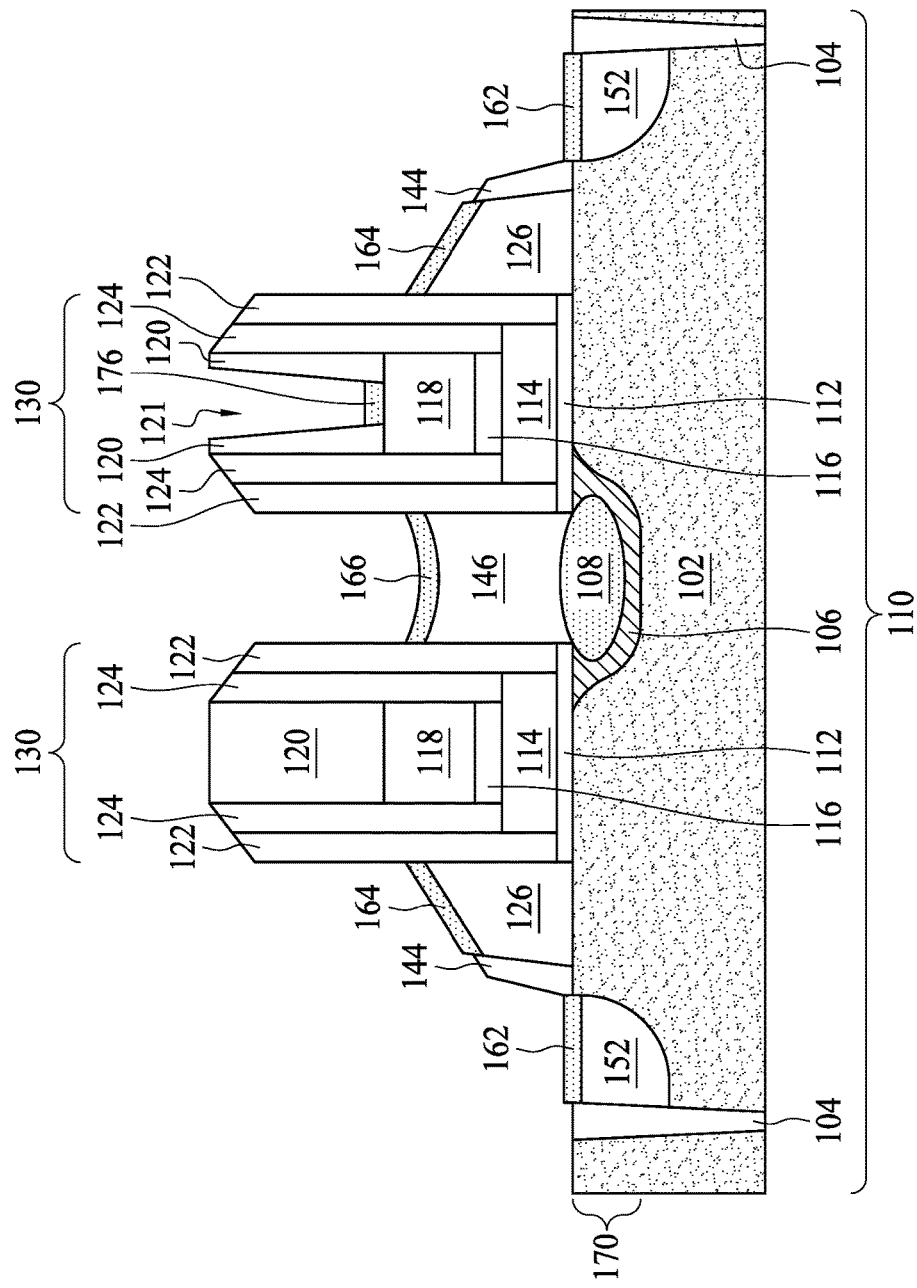

Subsequently, as illustrated in FIG. 9A, a silicidation operation is performed against the select gates 126, the erase gate 146, the drain regions 152 and the source/regions 154 and 156 on their surfaces. Accordingly, silicide layers 164, 166, 162, 172 and 174 are formed on the select gate 126, the erase gate 146, the drain regions of the memory cell 101, the source region 154 of the logic device 140 and the drain region 156 of the logic device 140, respectively. Further, as illustrated in FIG. 9B, a silicide layer 168 is formed on the portion 106-1 of the source region 106. Additionally, FIG. 9C shows a silicide layer 176 formed on the control gate 118 at the bottom of the via 121.

The formation of the silicide layers on the surface of the polysilicon materials may help reducing the contact resistance at the interface of the gates/doped regions and overlaying features. As a result, referring to FIG. 1 and FIG. 9B, the silicide layer 168 is only formed at the portion of the common source region 106-1. The remaining portions of the common source region 106 may not include silicide on the surface. Similarly, as shown in FIG. 1 and FIG. 9C, the silicide layer 176 is only formed at the position of the control gate contact plug 210 for the control gate 118.

The silicide layers may be formed of tungsten silicide, titanium silicide, cobalt silicide, nickel silicide and the like. In some embodiments, the silicide layers mentioned above may be formed by blanket deposition over the polysilicon material by suitable operations, such as low-pressure chemical vaporization deposition (LPCVD). Take tungsten silicide as an example, the silicide layer is formed by reacting tungsten fluoride ($WF_6$) with silane ($SiH_4$). Alternatively, the silicide layer may be formed by depositing a layer of selected metal over the polysilicon portion of the gates and doped regions, followed by an annealing operation so as to facilitate silicidation of the selected metal. In some embodiments, portions of the metal layer not reacting with the polysilicon may be removed. In some embodiments, the silicide layers for different gates and dope regions can be formed during a same silicidation operation. For example, the silicide layers (e.g., the silicide layers 164 and 166) away from the surface 102A can be formed in conjunction with the silicide layers (e.g., the silicide layers 162, 172 and 174) on the surface 102A or 102B of the semiconductor substrate 102. In comparison with existing methods that may require separate operations to complete the formation of all silicide layers, the proposed manufacturing procedure can save at least one photolithography operation.

Figure 10A:
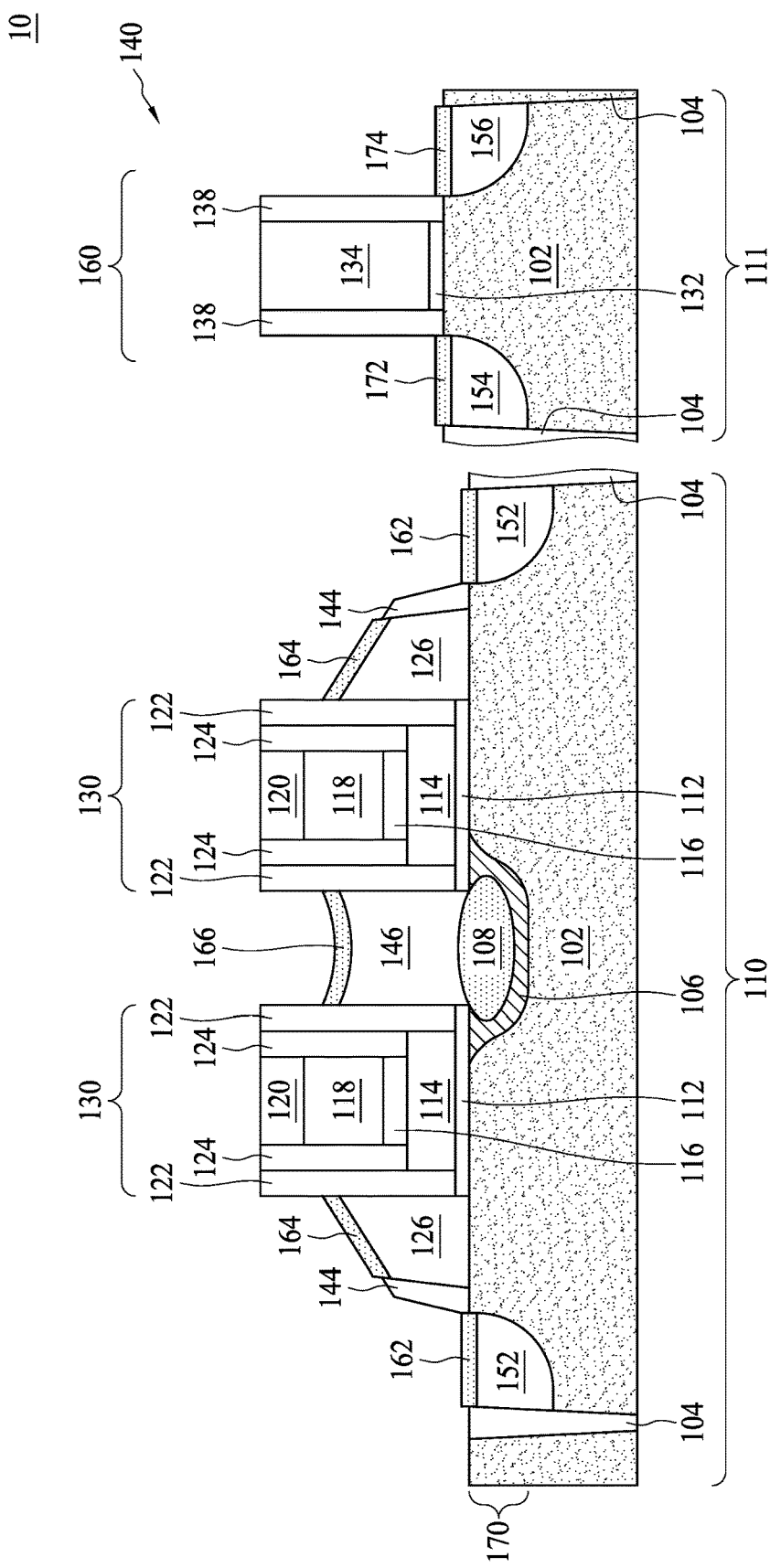
FIGS. 10A, 10B, and 10C are cross-sectional views of intermediate stages in manufacturing of a semiconductor structure in accordance with various embodiments of the present disclosure.
Figure 10B:
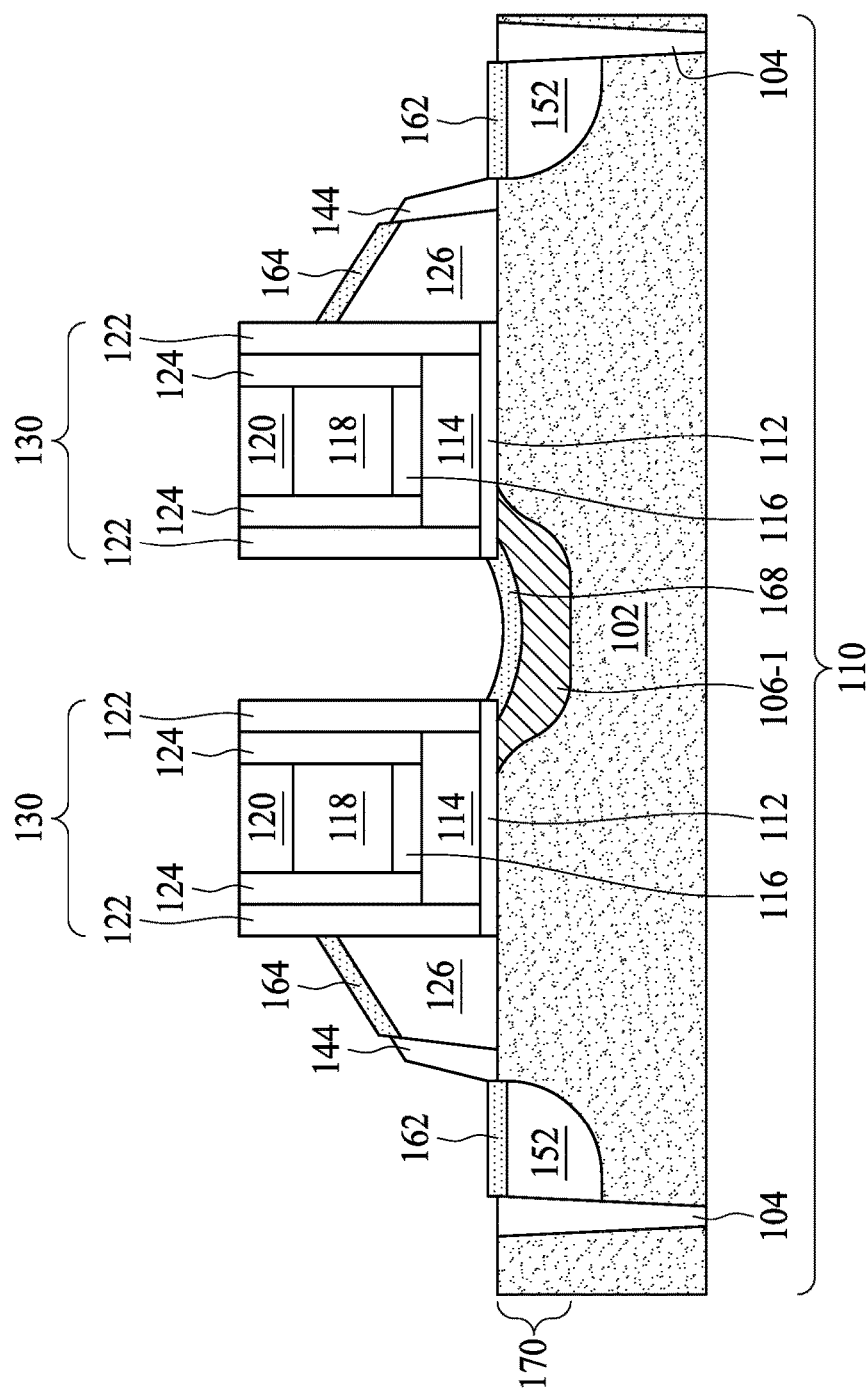
Figure 10C:
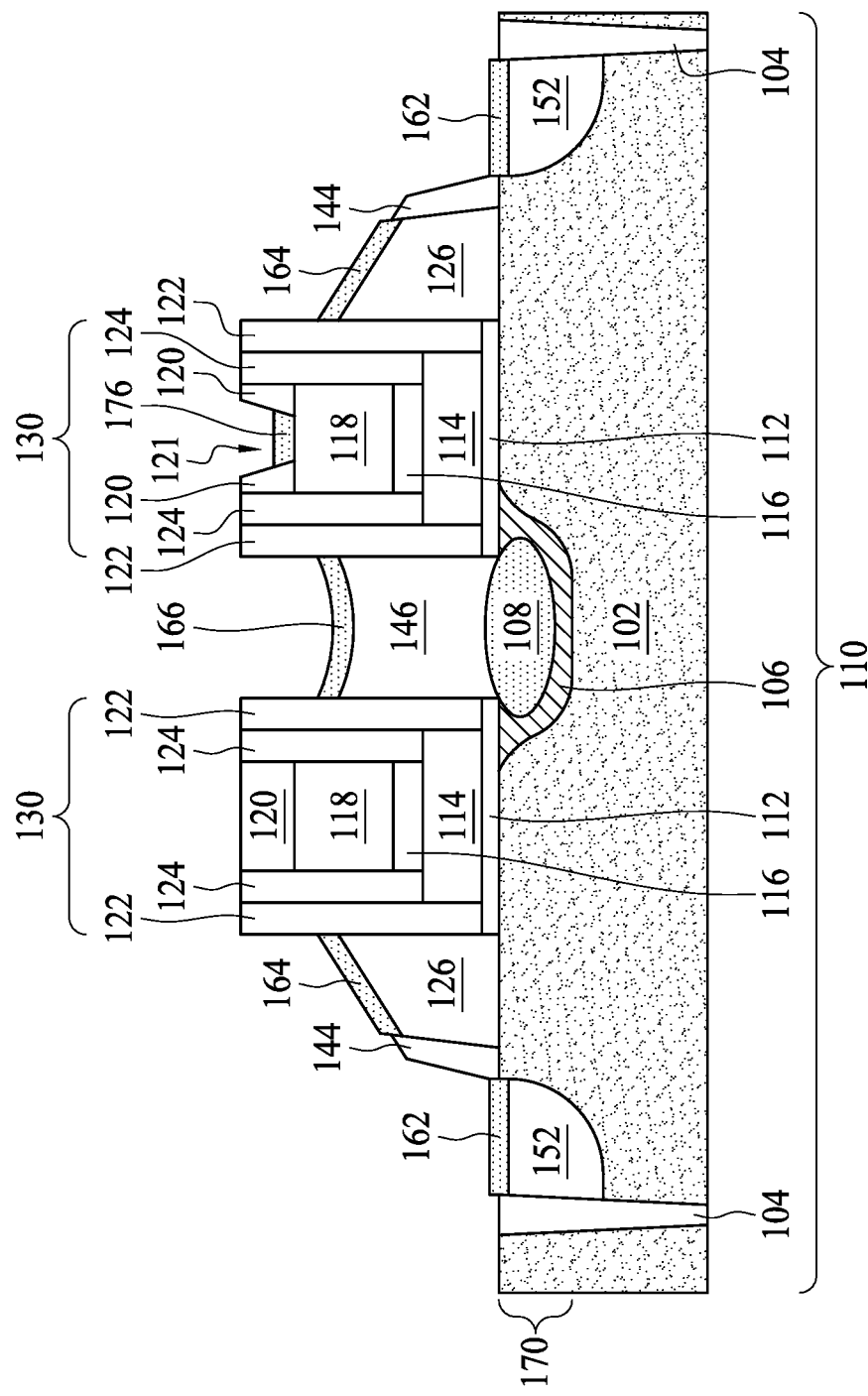

FIGS. 10A, 10B, and 10C are cross-sectional views of intermediate stages in manufacturing the semiconductor structure 10 in accordance with various embodiments of the present disclosure. A planarization operation is utilized to level the control gate structures 130 in the memory device region 110 and the gate structure 160 of the logic device region 111. In some embodiments, the planarization is performed by a chemical mechanical planarization (CMP) operation. Through the planarization, the mask layer 136 is removed from the gate structure 160 such that the gate layer 134 is exposed. In the meantime, the same planarization operation also removes a portion of the mask layers 120 of the control gate structure 130. In some embodiments, a top surface of the gate layer 134 for the logic device 140 is higher than the upper surface 118A of the control gate 118 for the memory cell 101. As a result, in an attempt to remove the mask layer 136 in order to expose the gate layer 134, a thickness of the mask layer 120 of the control gate structure 130 is retained. As a result, the control gates 118 are still covered by the thinned mask layer 120.

Since the select gates 126 and the erase gate 146 are made lower than the upper surface 118A of the control gate, the planarization operation would not affect the silicide layers 164 and 166 previously formed on the select gates 126 and 146, respectively. The proposed thinned gate structure enjoys an advantage that those gates may not be subject to any contaminant issues due to the planarization operation. In addition, the lowered control gate surface 118A would help in maintaining the integrity of the control gate 118 from being over thinned because the control gate is not subjected to any planarization operation. Thus, an improved thickness uniformity of the control gate 118 can be obtained.

Figure 11A:
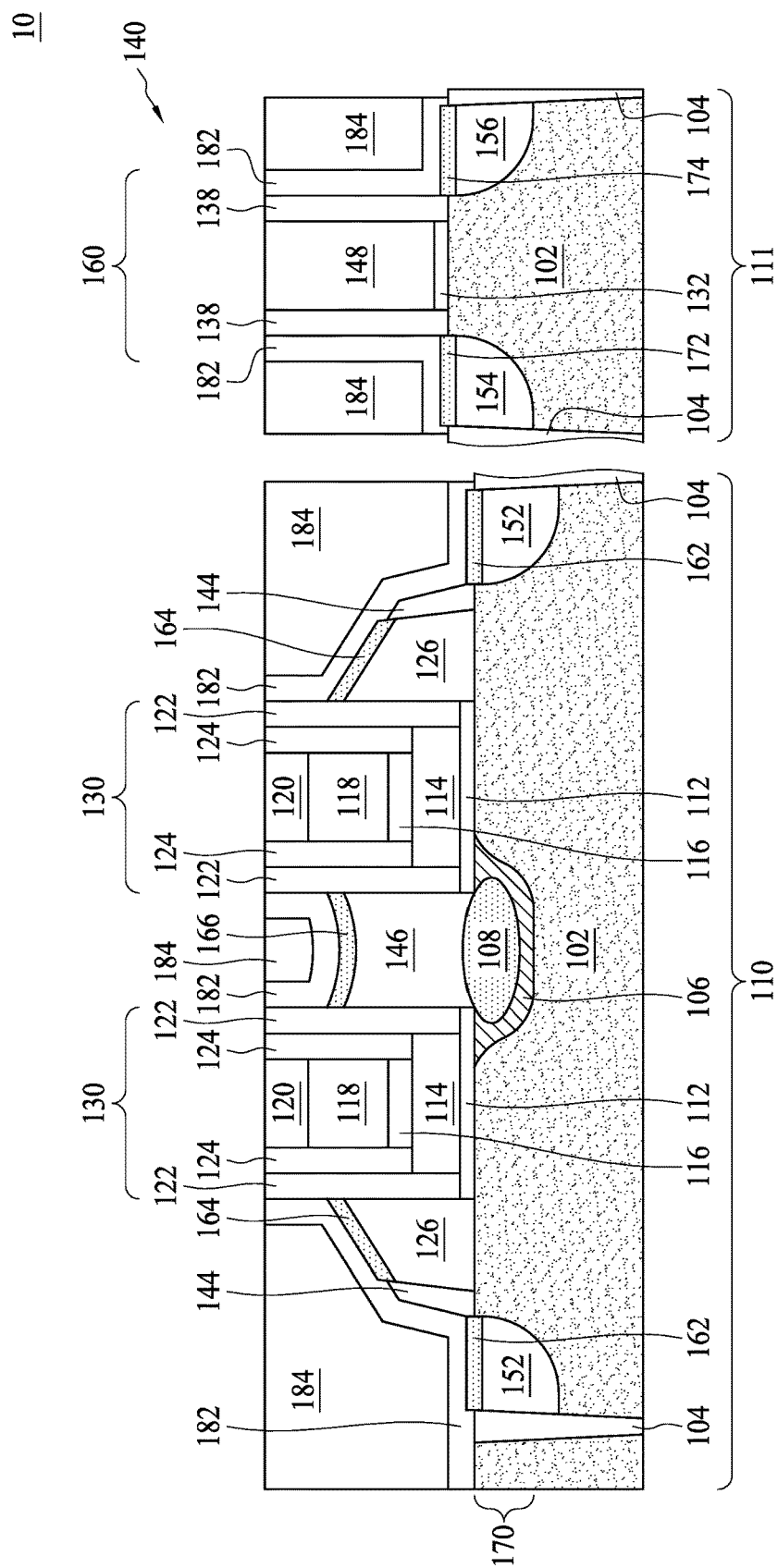
FIGS. 11A, 11B, and 11C are cross-sectional views of intermediate stages in manufacturing of a semiconductor structure in accordance with various embodiments of the present disclosure.
Figure 11B:
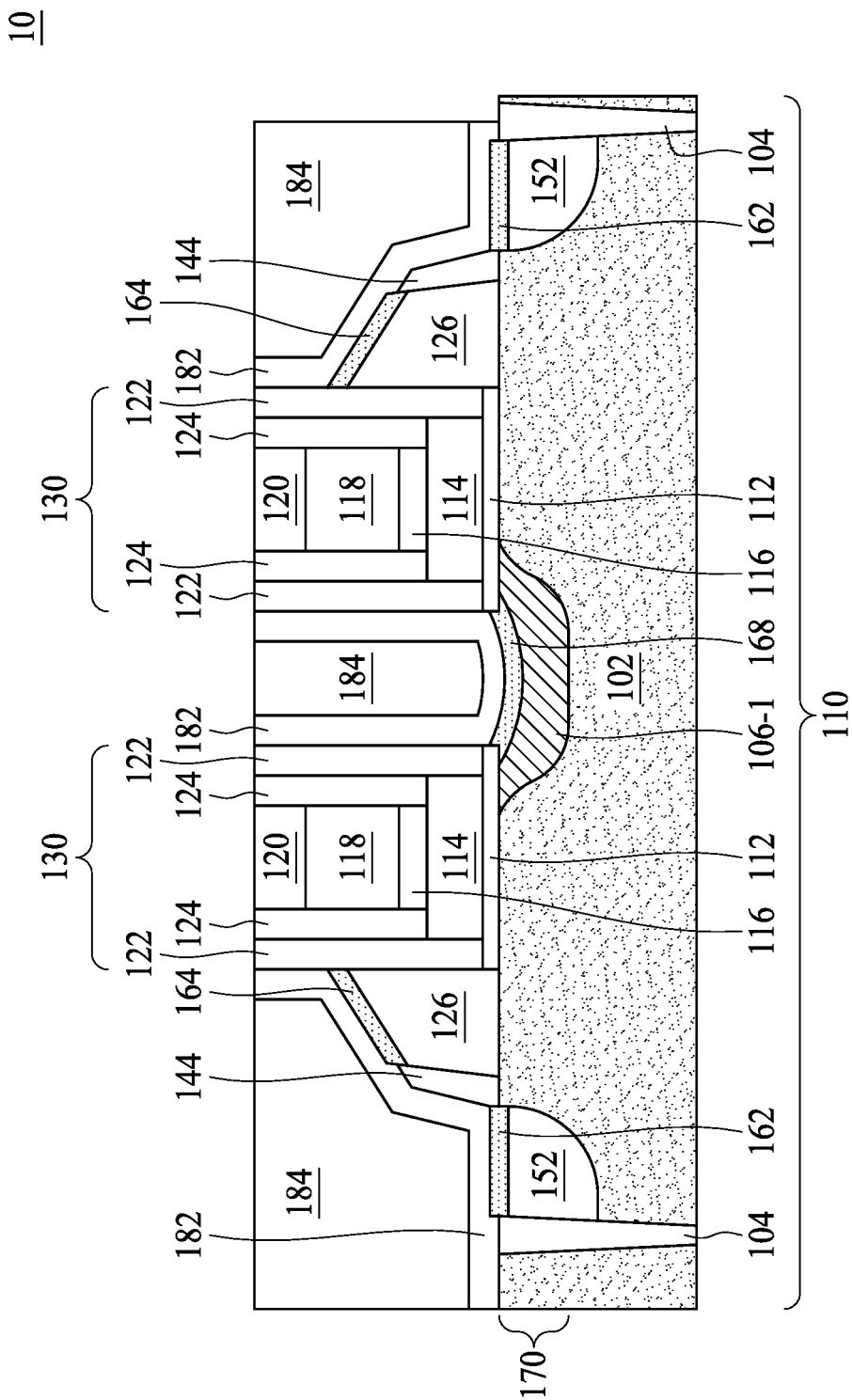
Figure 11C:
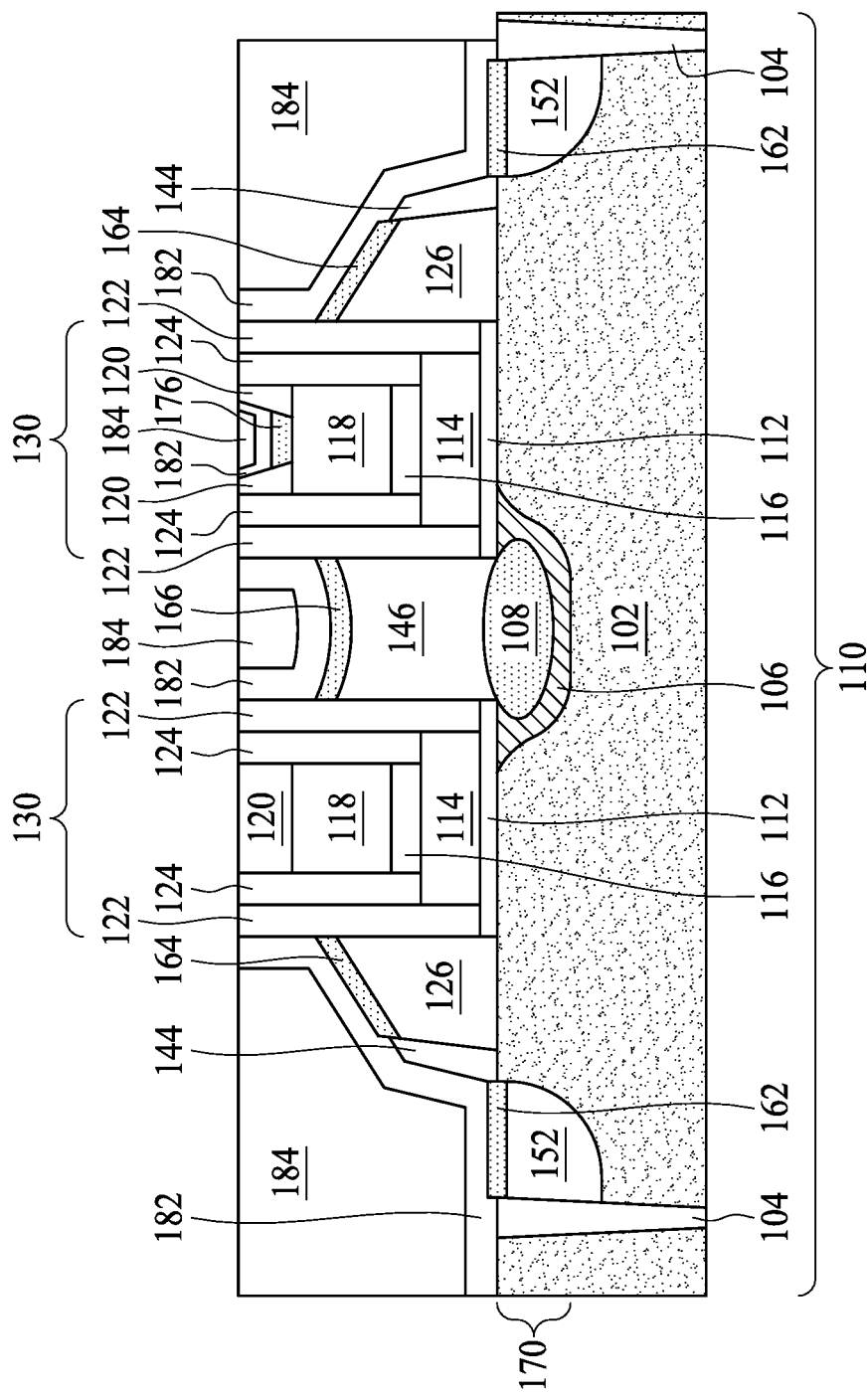

Subsequently, as illustrated in FIGS. 11A, 11B, and 11C, an etch stop layer 182 is formed over the semiconductor structure 10. The etch stop layer 182 is deposited across both of the memory device region 110 and the logic device region 111. The etch stop layer 182 may include a dielectric material, such as an nitride, oxide, silicon carbide, SiCN, SiOCN, SiOC, combination or the like. The etch stop layer 182 may be formed by suitable techniques, such as chemical vapor deposition (CVD) method.

Furthermore, a gap fill operation is performed to form a dielectric layer 184 over the etch stop layer 182. The dielectric layer 184 fills the spaces or gaps over the drain regions 152 and the erase gate 146. Additionally, the dielectric layer 184 fills the spaces or gaps over the source/drain regions 154 and 156. Similarly, referring to FIG. 11B, the dielectric layer 184 is in physical contact with the source region portion 106-1. The etch stop layer 182 and the dielectric layer 184 fills the space above the portion 161-1. Furthermore, FIG. 11C shows that the dielectric layer 184 is in physical contact with the silicide layer 176 of the control gate 118. The etch stop layer 182 and the dielectric layer 184 fill the via 121. Also, a portion of the dielectric layer 184 is disposed directly over silicide layers 164 of the select gate 126. In some embodiments, the dielectric layer 184 surrounds the control gate structure 130 laterally around the mask layer 120 and the control gate 118.

Since the select gates 126 of the memory cell 101 are lowered, the gaps above the drain region 152 are thus made wider. In other words, the gap directly over the drain region 152 have an aspect ratio smaller than existing methods that have select gates leveled with the control gates or the mask layer of the control gate structure 130. As such, gap fill operations can be performed more effectively with fewer or no voids left in the gaps. As a result, the memory cell performance can be enhanced.

Then, a planarization operation is utilized for removing excessive materials of the etch stop layer 182 and the dielectric layer 184. Accordingly, a leveled surface of the dielectric layer 184 across the memory cell pair 100 and the logic device 140 is obtained. The gate layer 134 is exposed from the dielectric layer 184 while the mask layer 120 of the memory cell 101 still covers the control gates 118. In some embodiments, the dielectric layer 184 of the logic device 140 is leveled with the thinned mask layer 120 of the memory cell 101. In some embodiments, the dielectric layer 184 of the memory cell 101 includes an upper surface higher than the upper surface 118A of the control gate 118 due to the presence of the residual mask layer 120.

In some embodiments, a replacement gate operation is employed to form a gate stack 148 in place of the gate layer 134. The gate stack 148 may be formed by initially removing the gate layer 134 such that a trench is left in place of the gate layer, followed by depositing one or more layers in the trench. Although illustrated with one layer in FIG. 11A, the gate stack 148 may include multiple layers e.g., one or more work function layer, a blocking layer and a conductive layer, which are sequentially lined to the sidewalls of the trench in order and fill the trench. The excessive materials of the gate stack 148 may be removed by a planarization operation in order to expose portions of the gate layer 148. In some embodiments, the dielectric layer 184 is leveled with the replacement gate stack 148.

Figure 12A:
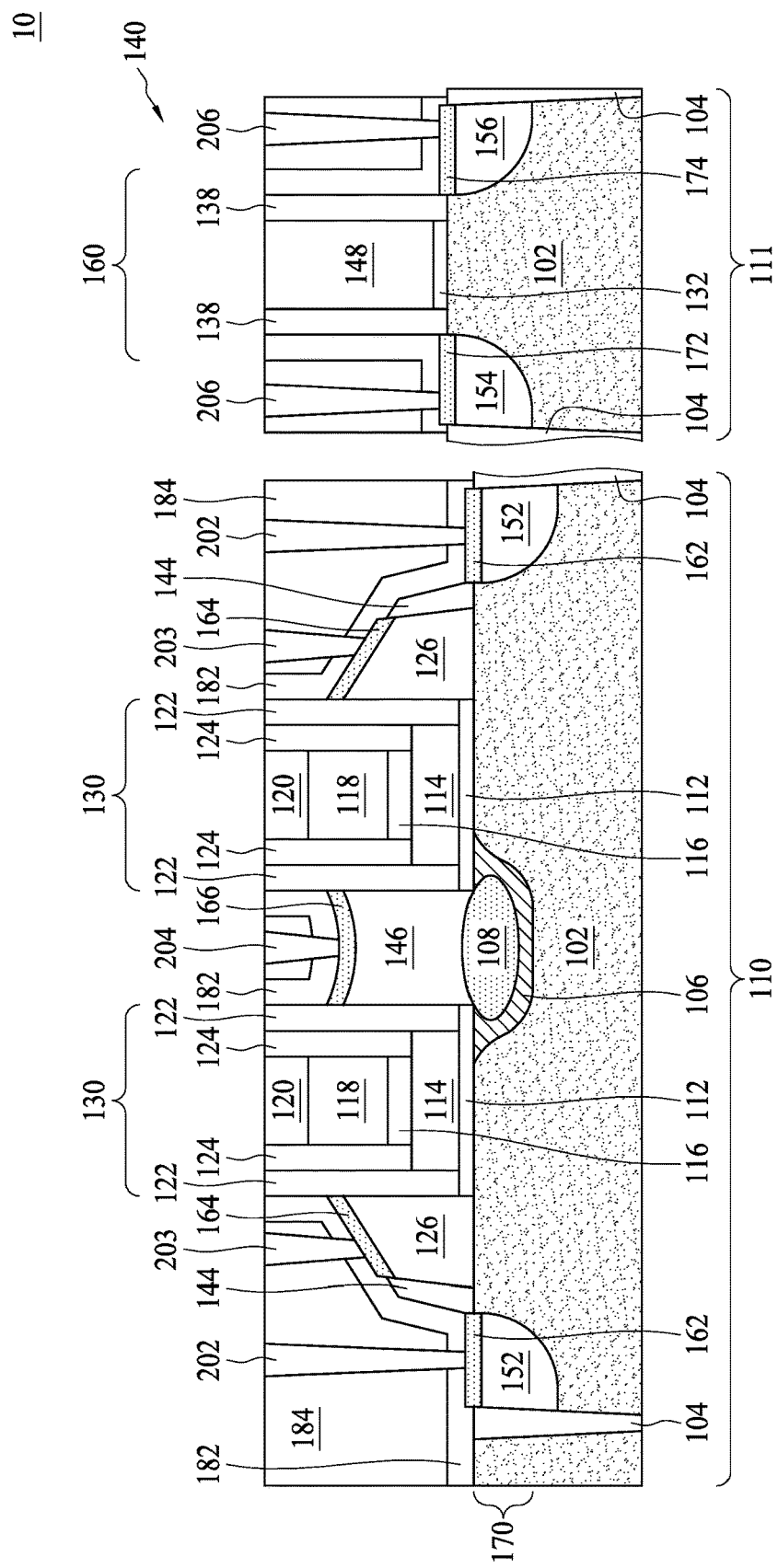
FIGS. 12A, 12B, and 12C are cross-sectional views of intermediate stages in manufacturing of a semiconductor structure in accordance with various embodiments of the present disclosure.
Figure 12B:
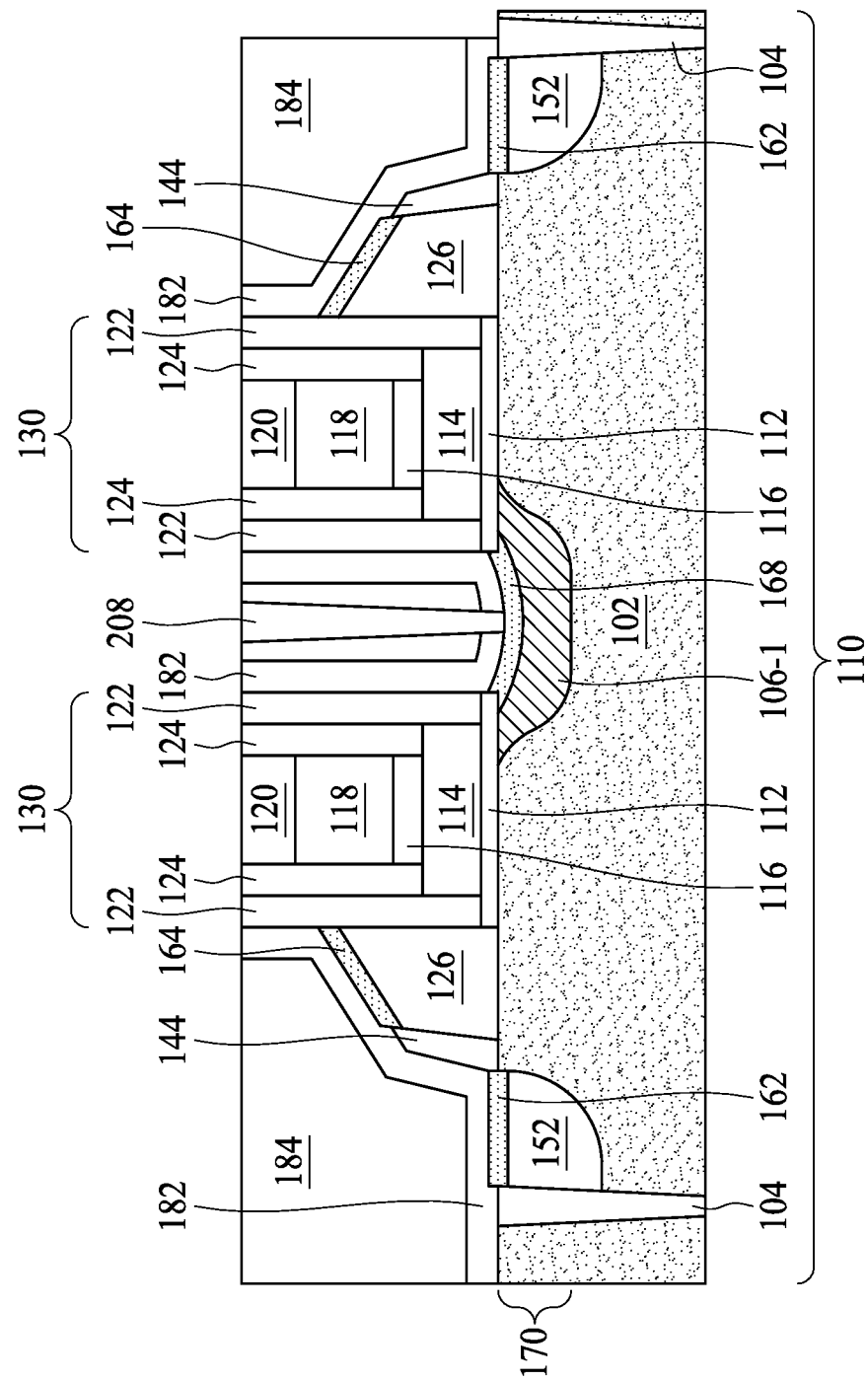
Figure 12C:
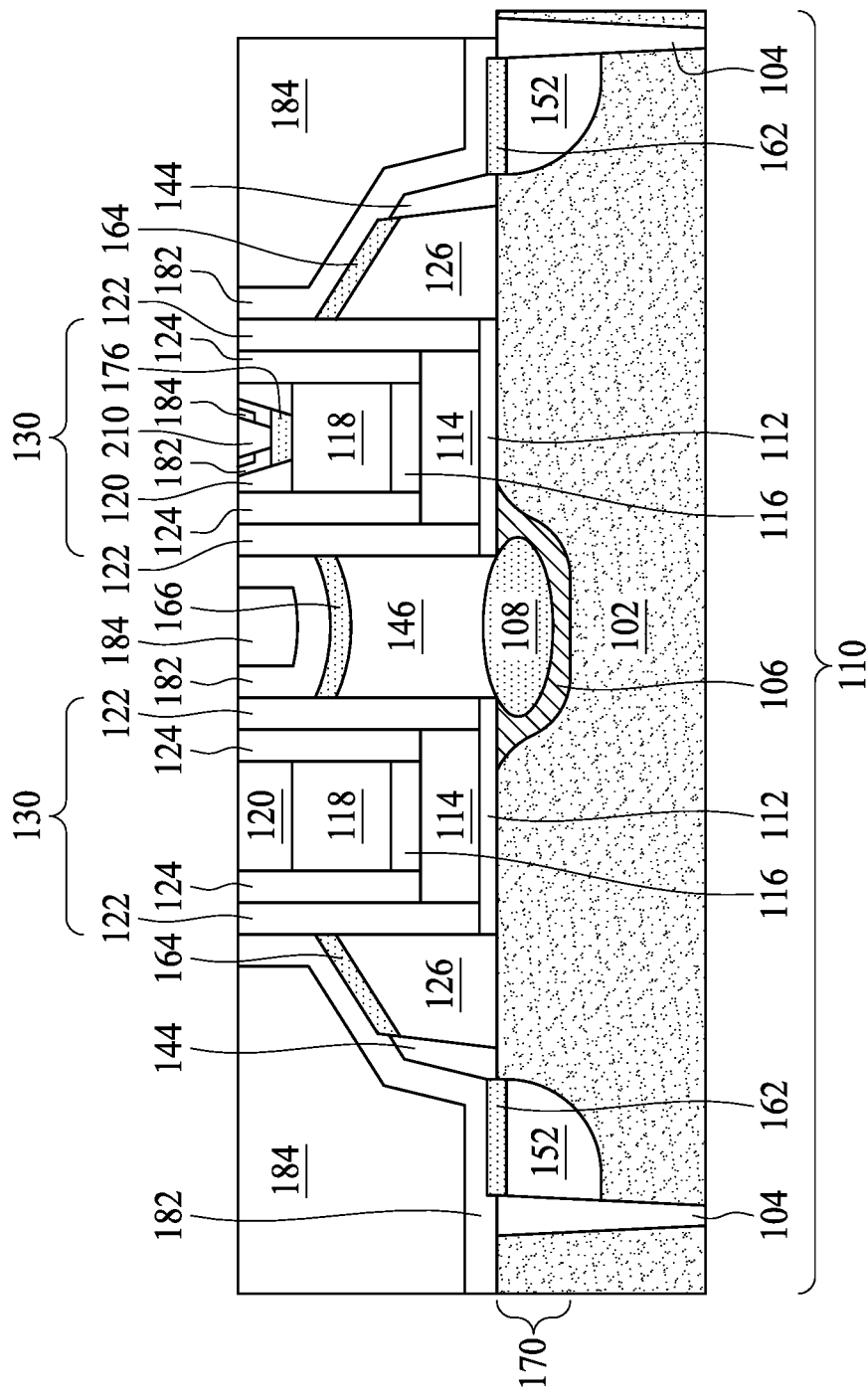

Referring to FIG. 12A, several contacts plug are formed to electrically connect the respective gates and regions. FIG. 12A illustrates an example in which conduct plugs 202, 203 and 204 are formed through the dielectric layer 184 and over the drain regions 152, the select gates 126 and the erase gate 146, respectively, within the memory device region 110. Also, FIG. 12A illustrates conduct plugs 206 formed through the dielectric layer 184 and over the source/drain regions 154 and 156. Referring to FIG. 12B, the contact plug 208 is formed over the source region portion 106-1. The etch stop layer 182 and the dielectric layer 184 are disposed to ensure electrical isolation between the erase gate 146 and the source region portion 106-1, and/or electrical isolation between the erase gate 146 and the source region contact plug 208. Moreover, FIG. 12C shows the contact plug 210 formed in the via 121 over the control gate 118. The contact plugs may be formed of conductive materials, such as copper, tungsten or the like. In some embodiments, the contact plugs may not be aligned with each other. For example, the individual contact plugs mentioned above can be arranged in different spacing values or in a staggered configuration.

The present disclosure presents a method of manufacturing a semiconductor structure, in which a memory cell is formed on a semiconductor substrate, the memory cell including a control gate, a select gate and a source region. A logic device is formed on the semiconductor substrate, where the logic device includes a gate layer and a source/drain region. The select gate is thinned such that the select gate is lower than an upper surface of the control gate. A silicidation operation is performed for the source region and the select gate of the memory cell, and a dielectric layer is deposited over the source region and the drain region of the memory cell, and the drain/source region of the logic device.

The present disclosure provides a method of manufacturing a semiconductor structure, where a memory cell is formed on a semiconductor substrate, and the memory cell includes a control gate, a select gate, and a first mask layer over the control gate. A logic device is formed on the semiconductor substrate, where the logic device includes a gate layer, a source/drain region and a second mask layer over the gate stack. The select gate is thinned thereby the select gate is lower than an upper surface of the control gate. A silicidation operation is performed for the source region and the select gate of the memory cell.

The present disclosure provides a semiconductor structure. The semiconductor structure includes a semiconductor substrate and a memory cell disposed on the semiconductor substrate, where the memory cell includes a select gate, a control gate and a source region. The semiconductor structure also includes a logic device disposed on the semiconductor substrate, where the logic device includes a gate stack and a source/drain region. A dielectric layer is disposed over the memory cell and the logic device, and the dielectric layer has an upper surface higher than an upper surface of the control gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, the method comprising:
    forming a memory cell on a semiconductor substrate, the memory cell comprising a control gate, a select gate and a source region;
    forming a logic device on the semiconductor substrate, the logic device comprising a gate layer and a source/drain region;
    thinning the select gate to be lower than an upper surface of the control gate;
    performing a silicidation operation on the source region and the select gate of the memory cell; and
    depositing a dielectric layer over the source region and the drain region of the memory cell and the source/drain region of the logic device.

2. The method of claim 1, wherein thinning the select gate comprises:
    depositing a coating over the control gate, the select gate and the source region of the memory cell; and
    etching the coating and the select gate until the select gate is lower than the upper surface of the control gate by a height.

3. The method of claim 2, wherein depositing the coating over the control gate, the select gate and the source region of the memory cell comprises depositing the coating over the gate layer and the source/drain region of the logic device.

4. The method of claim 2, further comprising, subsequent to etching the coating and the select gate, removing residues of the coating thereby exposing the source region of the memory cell and the source/drain region of the logic device.

5. The method of claim 1, wherein forming a memory cell on a semiconductor substrate further comprises forming a source dielectric over the source region, and wherein thinning the select gate further comprises forming an erase gate over the source dielectric and thinning the erase gate along with the thinned select gate.

6. The method of claim 5, wherein performing a silicidation operation on the source region and the select gate of the memory cell comprises forming a silicide layer on the thinned erase gate.

7. The method of claim 1, wherein forming a memory cell on a semiconductor substrate further comprises forming a first mask layer over the control gate, and wherein forming a logic device on the semiconductor substrate further comprises forming a second mask layer over the gate layer.

8. The method of claim 7, further comprising, prior to depositing a dielectric layer over the source region and the drain region of the memory cell and the source/drain region of the logic device, thinning the first mask layer of the memory cell and removing the second mask layer while exposing the gate layer of the logic device.

9. The method of claim 8, wherein thinning the first mask layer of the memory cell comprises leaving the control gate covered by the thinned first mask layer.

10. The method of claim 8, further comprising leveling the dielectric layer of the logic device with the thinned first mask layer of the memory cell.

11. The method of claim 1, wherein performing a silicidation operation for the source region and the select gate of the memory cell comprises forming a silicide layer on the source/drain region of the logic device.

12. A method of manufacturing a semiconductor structure, the method comprising:
    forming a memory cell on a semiconductor substrate, the memory cell comprising a control gate, a select gate, and a first mask layer over the control gate;
    forming a logic device on the semiconductor substrate, the logic device comprising a gate layer, a source/drain region and a second mask layer over the gate layer;
    thinning the select gate to be lower than an upper surface of the control gate; and
    performing a silicidation operation on the thinned select gate of the memory cell.

13. The method of claim 12, further comprising performing a planarization operation for thinning the first mask layer and removing the second mask layer.

14. The method of claim 13, further comprising depositing a dielectric layer over the select gate, the dielectric layer being leveled with the thinned first mask layer.

15. The method of claim 12, further comprising forming an erase gate prior to thinning the select gate of the memory cell, wherein thinning the select gate comprises thinning the erase gate to be lower than an upper surface of the control gate.

16. A method of manufacturing a semiconductor structure, the method comprising:
    forming a memory cell on a semiconductor substrate, the memory cell comprising a control gate, a select gate and an erase gate, each of the select gate and the erase gate having an upper surface higher than an upper surface of the control gate;
    forming a logic device on the semiconductor substrate, the logic device comprising a gate layer and a source/drain region;
    thinning the select gate and the erase gate of the memory cell to be lower than the control gate; and
    performing a silicidation operation on the thinned select gate and erase gate of the memory cell and the source/drain region of the logic device.

17. The method of claim 16, wherein forming a memory cell on a semiconductor substrate further comprises forming a first mask layer over the control gate, wherein forming a logic device on the semiconductor substrate further comprises forming a second mask layer over the gate layer, and the method further comprises thinning the first mask layer and the second mask layer subsequent to performing a silicidation operation on the thinned select gate and erase gate.

18. The method of claim 17, wherein thinning operation on the first mask layer and the second mask layer leaves a portion of the first mask layer on the control gate while removing the second mask layer, thereby exposing the gate layer of the logic device.

19. The method of claim 17, further comprising forming a contact plug electrically connecting the erase gate through the thinned first mask layer.

20. The method of claim 16, further comprising forming an etch stop layer covering the thinned erased gate and selected gate subsequent to the silicidation operation.

* * * * *